(12) United States Patent
Jun et al.

(10) Patent No.: US 10,636,785 B2
(45) Date of Patent: Apr. 28, 2020

(54) SEMICONDUCTOR DEVICE

(71) Applicant: Samsung Electronics Co., Ltd., Suwon-si, Gyeonggi-do (KR)

(72) Inventors: Hwichan Jun, Yongin-si (KR); Deokhan Bae, Hwaseong-si (KR); HeonJong Shin, Yongin-si (KR); Jaeran Jang, Suwon-si (KR); Moon Gi Cho, Anyang-si (KR); YoungWoo Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/395,593

(22) Filed: Apr. 26, 2019

(65) Prior Publication Data
US 2019/0252372 A1 Aug. 15, 2019

Related U.S. Application Data

(63) Continuation of application No. 15/689,418, filed on Aug. 29, 2017, now Pat. No. 10,453,838.

(30) Foreign Application Priority Data

Nov. 9, 2016 (KR) ........................ 10-2016-0149081

(51) Int. Cl.
| | | |
|---|---|---|
| *H01L 27/06* | (2006.01) | |
| *H01L 23/522* | (2006.01) | |
| *H01L 49/02* | (2006.01) | |
| *H01L 21/8238* | (2006.01) | |
| *H01L 27/092* | (2006.01) | |
| *H01L 29/06* | (2006.01) | |

(Continued)

(52) U.S. Cl.
CPC .. *H01L 27/0629* (2013.01); *H01L 21/823821* (2013.01); *H01L 23/5226* (2013.01); *H01L 23/5228* (2013.01); *H01L 27/0924* (2013.01); *H01L 28/20* (2013.01); *H01L 29/0696* (2013.01); *H01L 29/785* (2013.01); *H01L 21/32139* (2013.01); *H01L 23/53295* (2013.01)

(58) Field of Classification Search
CPC ........................................................ H01L 27/06
See application file for complete search history.

(56) References Cited

U.S. PATENT DOCUMENTS

| | | |
|---|---|---|
| 6,316,816 B1 | 11/2001 | Matsumoto |
| 6,656,791 B2 | 12/2003 | Shin et al. |

(Continued)

FOREIGN PATENT DOCUMENTS

| | | |
|---|---|---|
| JP | 2013122947 A | 6/2013 |
| JP | 2013197515 A | 9/2013 |

(Continued)

*Primary Examiner* — Marvin Payen
(74) *Attorney, Agent, or Firm* — Harness, Dickey & Pierce, P.L.C.

(57) ABSTRACT

A semiconductor device includes a substrate including a first region and a second region, a cell gate pattern on the first region of the substrate, a dummy gate pattern on the second region of the substrate, a resistor pattern on the second region of the substrate and over the dummy gate pattern, and a connection structure coupled to each of the connection regions. The resistor pattern includes a body region and connection regions at both sides of the body region. The dummy gate pattern overlaps the body region and does not be overlap the connection regions, when viewed in a plan view.

20 Claims, 29 Drawing Sheets

(51) Int. Cl.
*H01L 29/78* (2006.01)
*H01L 23/532* (2006.01)
*H01L 21/3213* (2006.01)

(56) References Cited

U.S. PATENT DOCUMENTS

| | | |
|---|---|---|
| 7,276,767 B2 | 10/2007 | Huttemann et al. |
| 7,319,254 B2 | 1/2008 | Kwak et al. |
| 7,332,403 B1 | 2/2008 | Hill et al. |
| 7,601,630 B2 | 10/2009 | Park et al. |
| 8,643,143 B2 | 2/2014 | Lee |
| 8,659,085 B2 | 2/2014 | Ng et al. |
| 8,680,618 B2 | 3/2014 | Eshun |
| 8,815,679 B1 | 8/2014 | Yen et al. |
| 8,859,386 B2 | 10/2014 | Lu et al. |
| 9,006,838 B2 | 4/2015 | Aggarwal et al. |
| 9,111,768 B2 | 8/2015 | Lu et al. |
| 2013/0161722 A1 | 6/2013 | Son et al. |
| 2013/0277754 A1 | 10/2013 | Liang et al. |
| 2014/0001568 A1 | 1/2014 | Wang et al. |
| 2015/0255335 A1 | 9/2015 | Beasor et al. |
| 2016/0020148 A1 | 1/2016 | Song et al. |

FOREIGN PATENT DOCUMENTS

| | | |
|---|---|---|
| KR | 20040008585 A | 1/2004 |
| KR | 20040016679 A | 2/2004 |
| KR | 20040108501 A | 12/2004 |
| KR | 20050079552 A | 8/2005 |
| KR | 20080030265 A | 4/2008 |
| KR | 20160009430 A | 1/2016 |

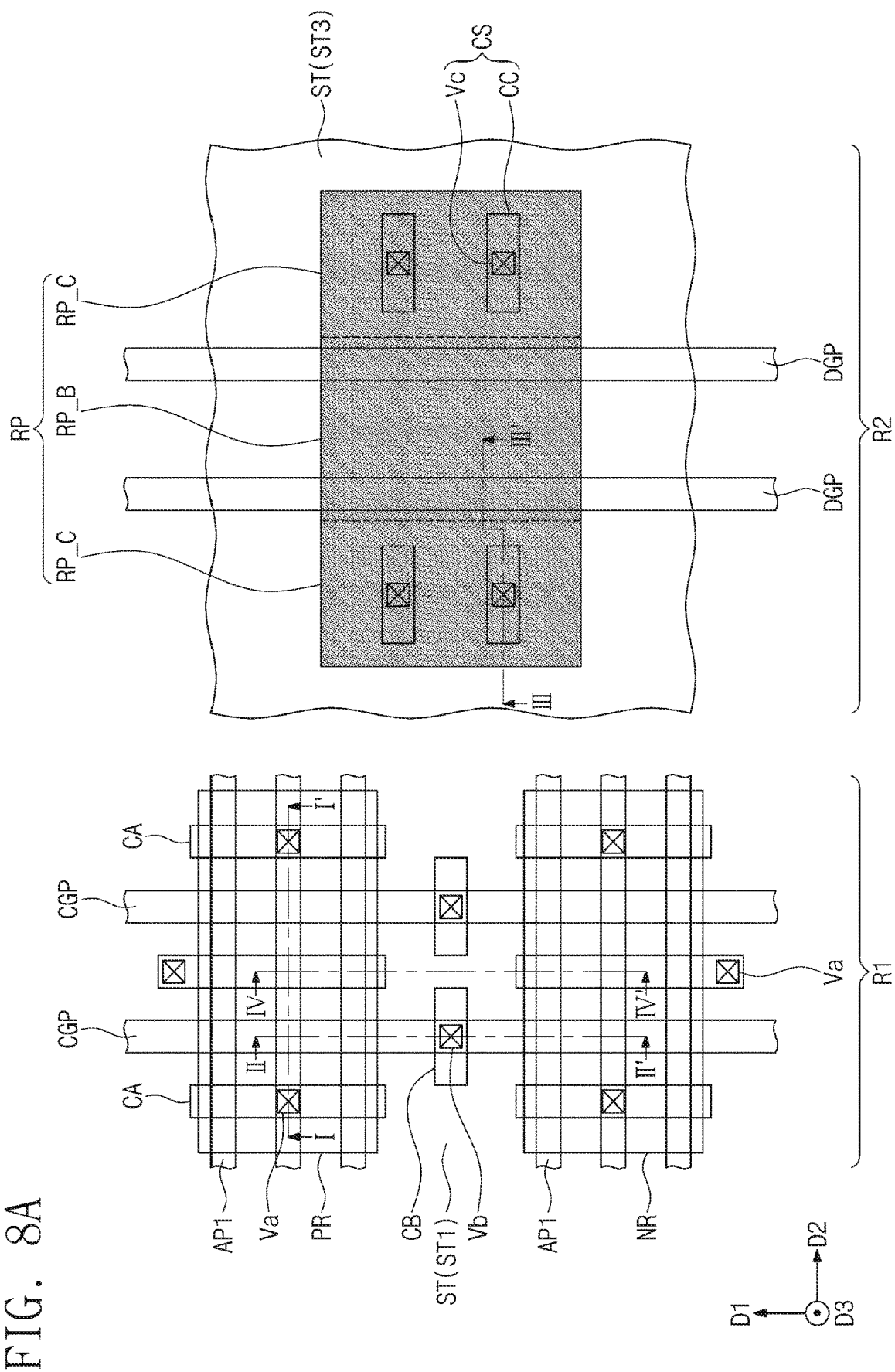

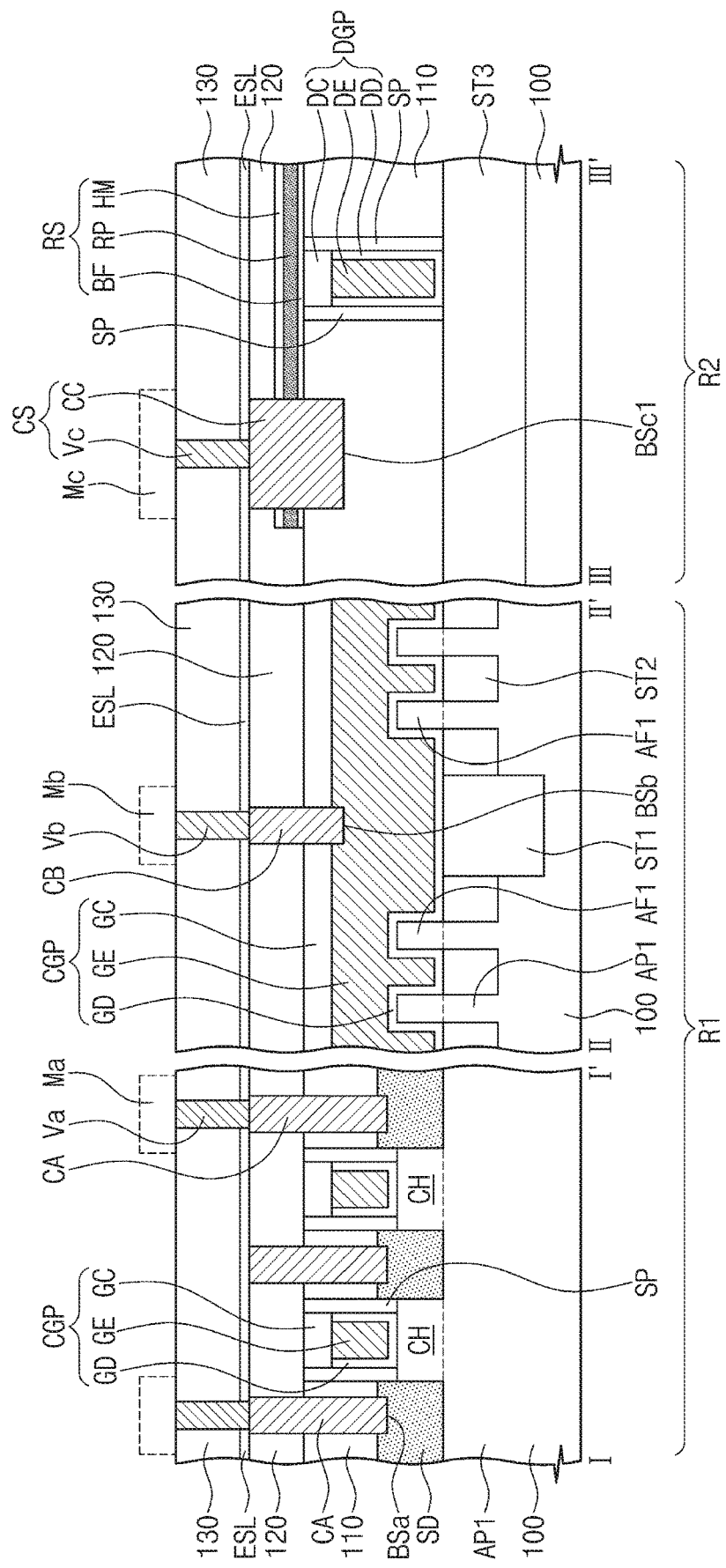

SEMICONDUCTOR DEVICE

CROSS-REFERENCE TO RELATED APPLICATIONS

This application is a continuation of U.S. application Ser. No. 15/689,418, filed Aug. 29, 2017, which claims priority under 35 U.S.C. § 119 to Korean Patent Application No. 10-2016-0149081, filed on Nov. 9, 2016, in the Korean Intellectual Property Office, the entire contents of each of which are hereby incorporated by reference.

BACKGROUND

The present disclosure relates to a semiconductor device, and in particular, to a semiconductor device including a field effect transistor and a resistor pattern.

Due to their small-size, multifunctional, low cost and/or other characteristics, semiconductor devices are used in the electronic industry. Semiconductor devices may be classified into a memory device for storing data, a logic device for processing data, and a hybrid device including both of memory and logic elements. To meet the increased demand for electronic devices with fast speed and/or low power consumption, developing semiconductor devices with high reliability, high performance, and/or multiple functions is desirable. Complexity and/or integration density of semiconductor devices may be increased.

SUMMARY

Some example embodiments of inventive concepts provide a highly reliable semiconductor device with improved electric characteristics.

According to some example embodiments of inventive concepts, a semiconductor device may include a substrate including a first region and a second region, a cell gate pattern on the first region of the substrate, a dummy gate pattern on the second region of the substrate, a resistor pattern provided on the second region of the substrate and over the dummy gate pattern, and a connection the resistor pattern including a body region and connection regions at both sides of the body region, and a connection structure coupled to each of the connection regions. The resistor pattern includes a body region and connection regions at both sides of the body region. The dummy gate pattern overlaps with the body region and does not be overlap the connection regions, when viewed in a plan view.

According to some example embodiments of inventive concepts, a semiconductor device may include a substrate including a first region and a second region, a transistor on the first region of the substrate, a dummy structure on the second region of the substrate and including a dummy contact, a lower interlayer insulating layer covering the cell transistor and the dummy structure, contacts in the lower interlayer insulating layer of the first region and coupled to the cell transistor, a resistor pattern on the lower interlayer insulating layer of the second region, and a connection via connected to the resistor pattern and the dummy contact. The resistor pattern may be arranged so the dummy contact is below the resistor pattern.

According to some example embodiments of inventive concepts, a semiconductor device may include a substrate including a first region and a second region, a cell gate pattern on the first region of the substrate, a source/drain region at a side of the cell gate pattern, a gate contact and a source/drain contact connected to the cell gate pattern and the source/drain region, respectively, and a resistor pattern on the second region of the substrate. A top surface of the gate contact and a top surface of the source/drain contact may be positioned at substantially the same level as a top surface of the cell gate pattern. The resistor pattern may be positioned at a level higher than the top surface of the source/drain contact and the top surface of the gate contact.

According to some example embodiments of inventive concepts, a semiconductor device may include a substrate including a first region and a second region, a cell transistor on the first region of the substrate, a dummy structure on the second region of the substrate and including dummy gate patterns, a lower interlayer insulating layer covering the cell transistor and the dummy structure, contacts on the first region and in the lower interlayer insulating layer and coupled to the cell transistor, a resistor pattern on the second region and on the lower interlayer insulating layer, and a connection via connected to the resistor pattern. The resistor pattern may be arranged so the dummy gate patterns are below the resistor pattern. The connection via may be arranged so the dummy gate patterns do not overlap with the connection via.

According to some example embodiments of inventive concepts, a semiconductor device may include a substrate including a first region and a second region, a plurality of gate patterns on the substrate and including a first gate pattern and a dummy gate pattern, a gate interconnect structure on a top surface of the first gate pattern, a resistor pattern on the second region of the substrate, and a connection structure extending through a connection portion of the resistor pattern. The resistor pattern includes a body portion and the connection portion extending from the body portion. The body portion is on top of a top surface of the dummy gate pattern. The connection structure includes a sidewall that is spaced apart from a sidewall of the dummy gate pattern. The first gate pattern extends in a first direction on the first region of the substrate and the dummy gate pattern extends in the first direction on the second region of the substrate.

BRIEF DESCRIPTION OF THE DRAWINGS

Inventive concepts will be more clearly understood from the following brief description taken in conjunction with the accompanying drawings. The accompanying drawings represent non-limiting, example embodiments as described herein.

FIG. 8A is a plan view illustrating a semiconductor device according to some example embodiments of inventive concepts, and FIG. 8B is a sectional view taken along lines I-I', II-II', and III-III' of FIG. 8A.

Figure 1A:
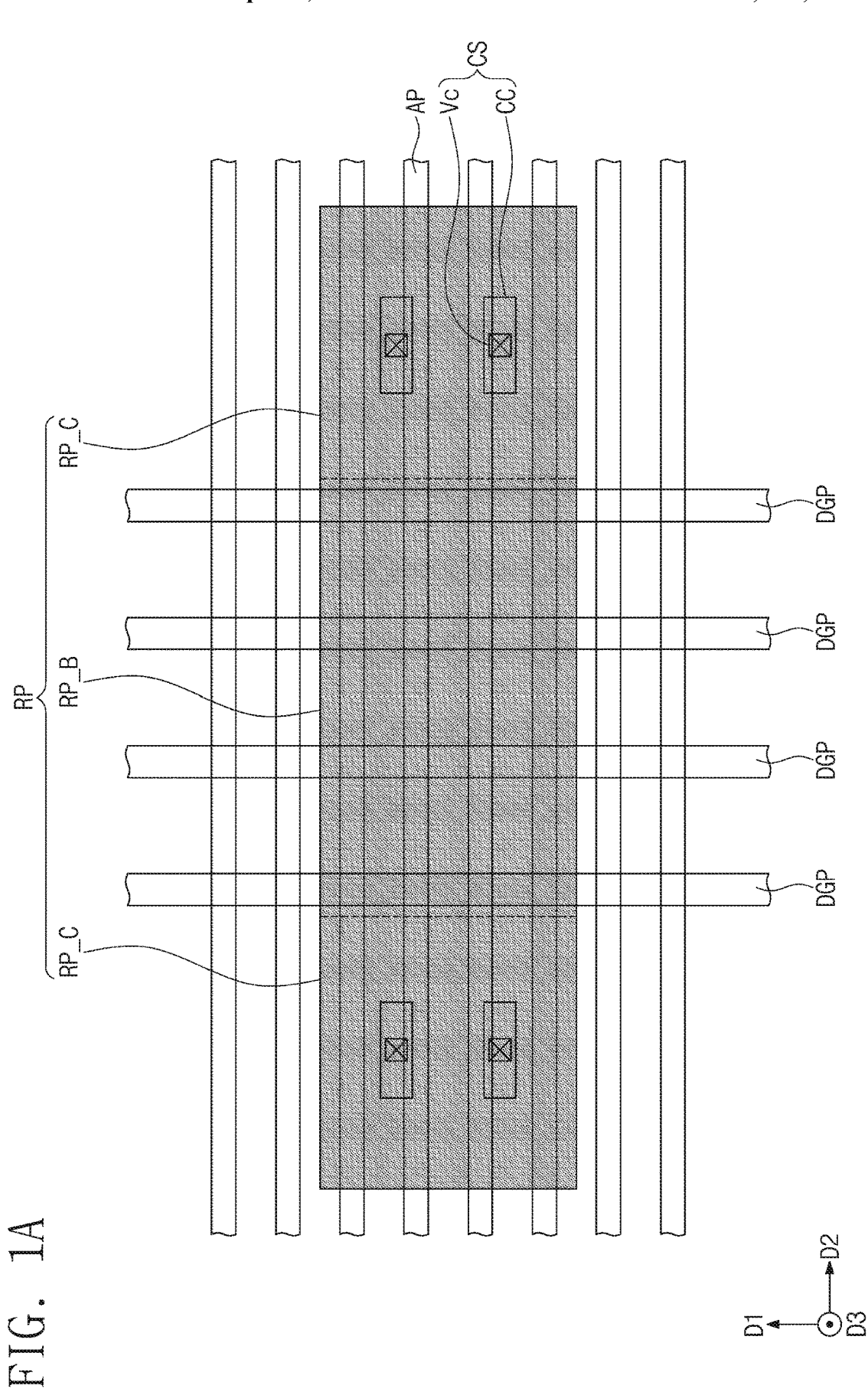
FIGS. 1A to 1D are plan views illustrating a resistor pattern of a semiconductor device according to some example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments are shown.

FIGS. 1A to 1D are plan views illustrating a resistor pattern of a semiconductor device according to some example embodiments of inventive concepts.

Referring to FIGS. 1A to 1D, a semiconductor device according to some example embodiments of inventive concepts may include a passive element (e.g., a resistor pattern RP) provided on a substrate. The resistor pattern RP may have a plate shape whose long axis is parallel to, for example, a first direction D1 or a second direction D2 crossing the first direction D. However, inventive concepts are not limited thereto.

In some example embodiments, the resistor pattern RP may include a pair of connection regions RP_C, which are adjacent to both end portions facing each other in its longitudinal direction, and a body region RP_B therebetween. One or more connection structures CS may be provided on each of the connection regions RP_C. The connection structure CS may be provided to electrically connect the resistor pattern RP to interconnection lines (not shown). In some example embodiments, the connection structure CS may include a connection via Vc and a lower contact CC below the connection via Vc. In some example embodiments, the connection structure CS may be configured to have only the connection via Vc. In other words, the lower contact CC may be omitted. The connection structure CS will be described in more detail below.

Dummy gate patterns DGP may be provided between the substrate and the resistor pattern RP. The dummy gate patterns DGP may extend in the first direction D1 and may be arranged to be spaced apart from each other in the second direction D2. The dummy gate patterns DGP may contribute to reduce a difference in pattern density between a region, on which the resistor pattern RP is formed, and another region, on which memory cells or logic circuits are formed. According to some example embodiments of inventive concepts, the dummy gate patterns DGP may not be provided below the connection regions RP_C of the resistor pattern RP. In other words, the body region RP_B of the resistor pattern RP may be overlapped with the dummy gate patterns DGP, and the connection regions RP_C may not be overlapped with the dummy gate patterns DGP.

Figure 1B:
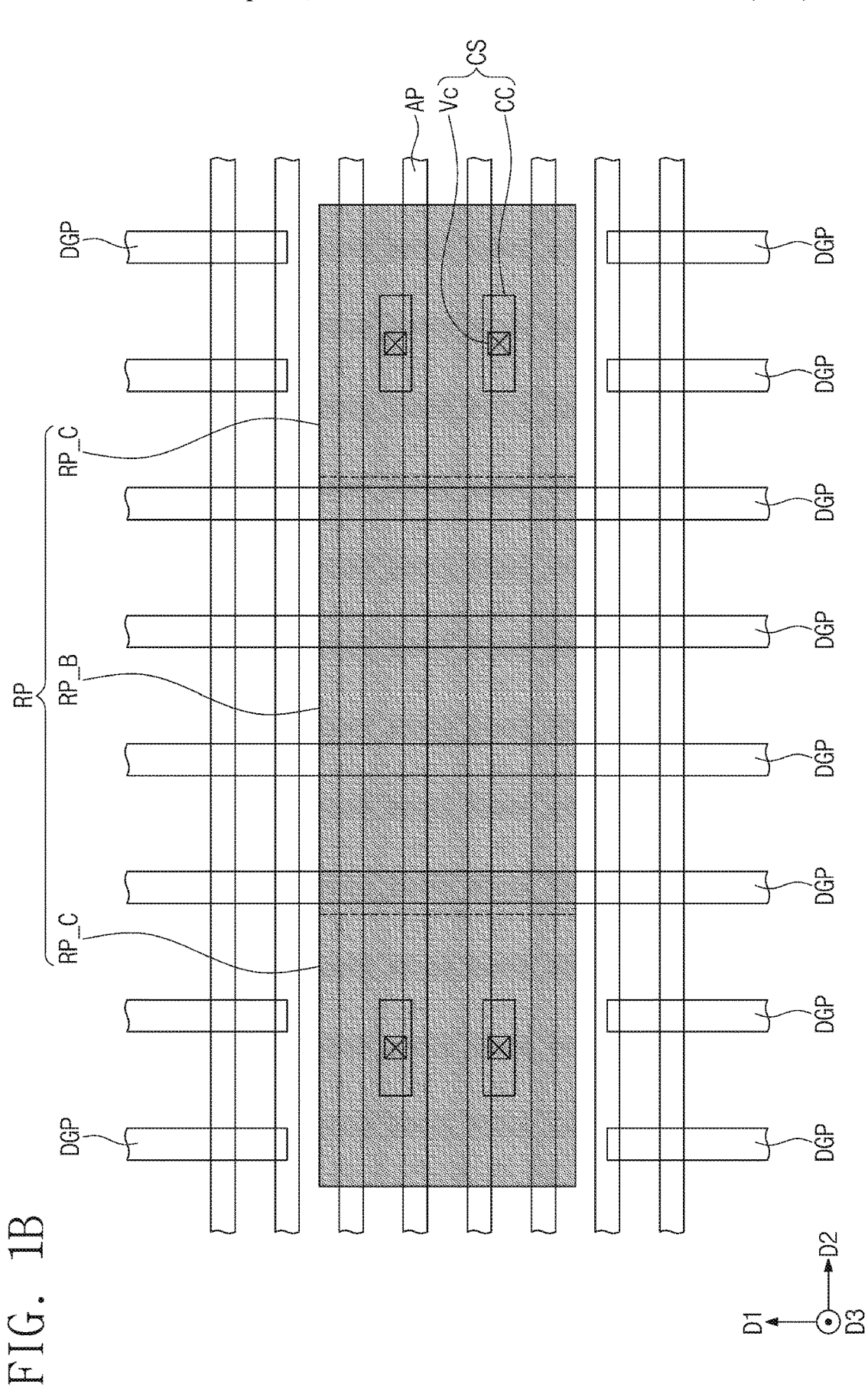

In some example embodiments, as shown in FIGS. 1A and 1B, the resistor pattern RP may have a long axis parallel to the second direction D2, and the dummy gate patterns DGP may be provided to cross the resistor pattern RP in the first direction D1. Here, the dummy gate patterns DGP may be completely removed from a region below the connection regions RP_C of the resistor pattern RP, as shown in FIG. 1A, or portions of the dummy gate patterns DGP overlapped with the connection regions RP_C may be partially removed, as shown in FIG. 1B. In FIG. 1B, for example, some of the dummy gate patterns DGP may be spaced apart from each other in the first direction D1 and the connection region RP_C of the resistor pattern RP may be interposed therebetween, when viewed in a plan view.

Figure 1C:
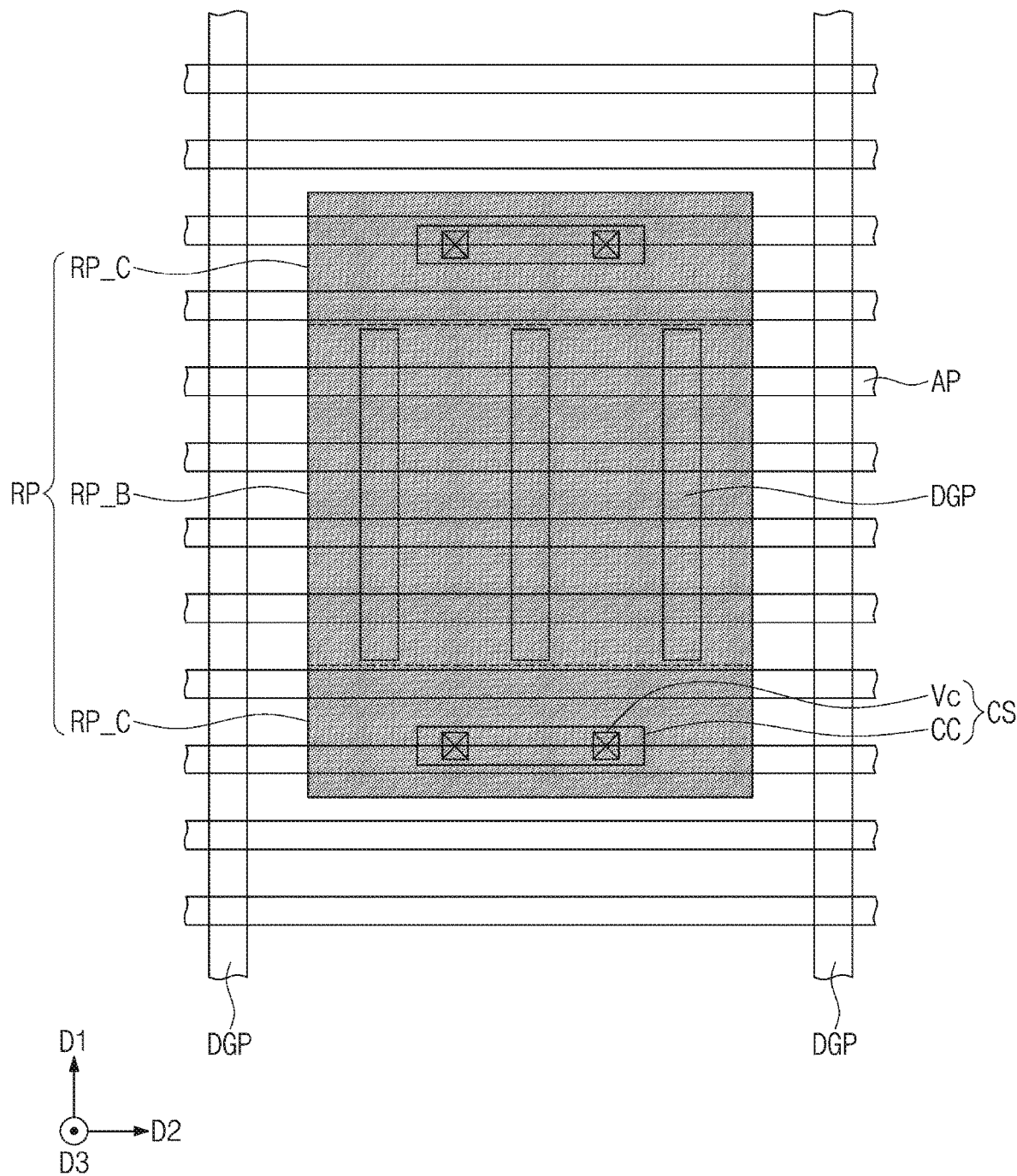
Figure 1D:
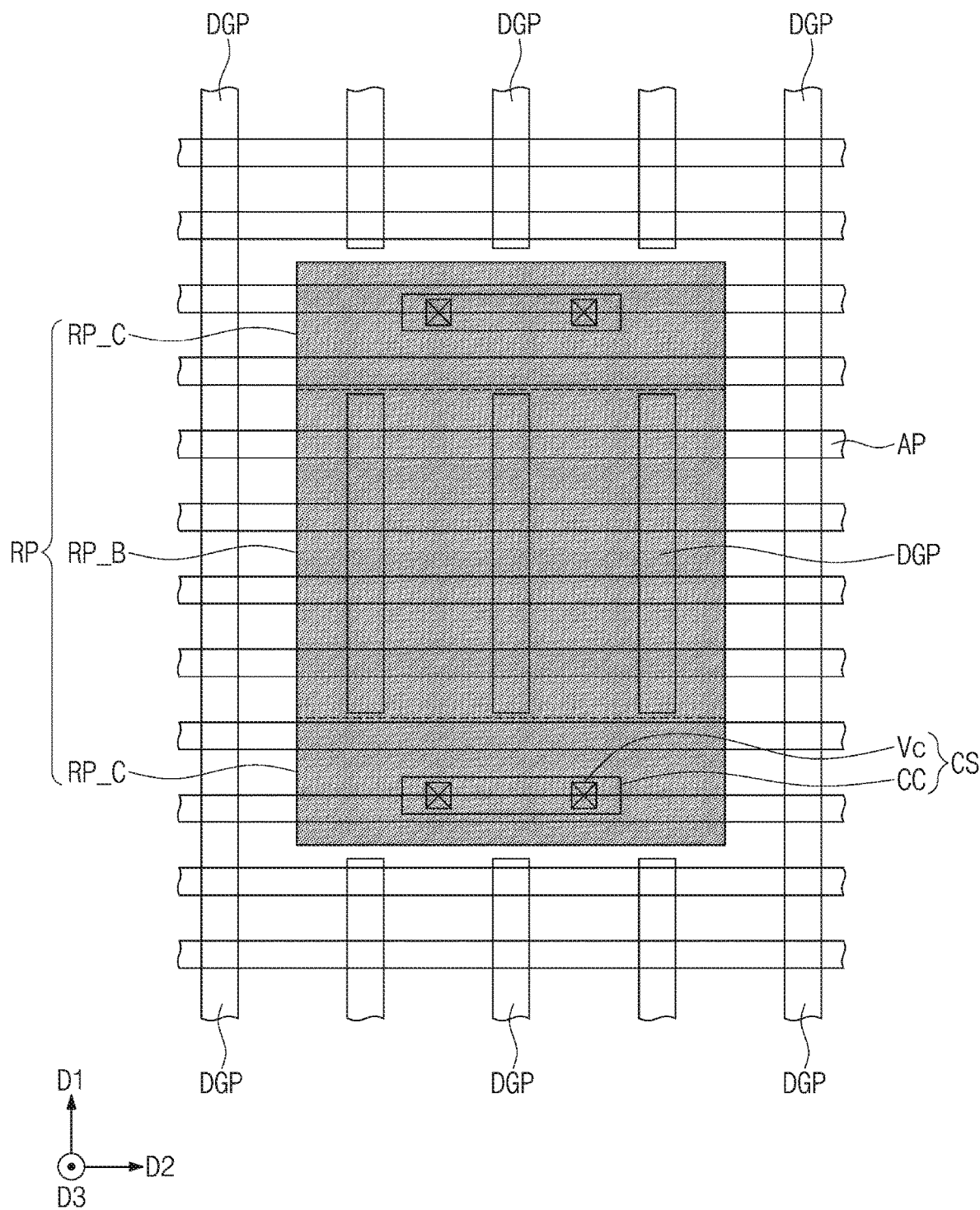

In some example embodiments, as shown in FIGS. 1C and 1D, the resistor pattern RP may have a long axis parallel to the first direction D1, and the dummy gate patterns DGP may extend parallel to the resistor pattern RP or in first direction D1. Here, for the dummy gate patterns DGP below the resistor pattern RP, all of portions of the dummy gate patterns DGP, which are not overlapped with the body region RP_B, may be completely removed as shown in FIG. 1C or portions of the dummy gate patterns DGP, which are overlapped with the connection regions RP_C, may be partially removed, as shown in FIG. 1D. For example, in FIG. 1D, some of the dummy gate patterns DGP may be spaced apart from each other in the first direction D1, and the dummy gate patterns DGP below the body region RP_B and the connection region RP_C may be interposed therebetween, when viewed in a plan view.

In some example embodiments, active patterns AP may be provided between the substrate and the dummy gate patterns DGP. The active patterns AP may be arranged to be spaced apart from each other in the first direction D1 and each of them may be a line shaped structure extending in the second direction D2. In other words, the active patterns AP may be provided to cross the dummy gate patterns DGP (e.g., orthogonally). The active patterns AP may have a structure protruding in a third direction D3 normal to a top surface of the substrate. In some example embodiments, the active patterns AP may be omitted, unlike that illustrated in the drawings.

In some example embodiments, since the dummy gate patterns DGP are not provided below the connection regions RP_C of the resistor pattern RP, on which the connection structure CS is provided, it is possible to limit and/or prevent the connection structure CS and the dummy gate patterns DGP from being coupled to each other. Accordingly, it is possible to stably control or maintain a resistance value of the resistor pattern. A semiconductor device, in which the resistor pattern RP and the dummy gate patterns DGP are provided in the above structure, will be described in detail below.

Figure 2:
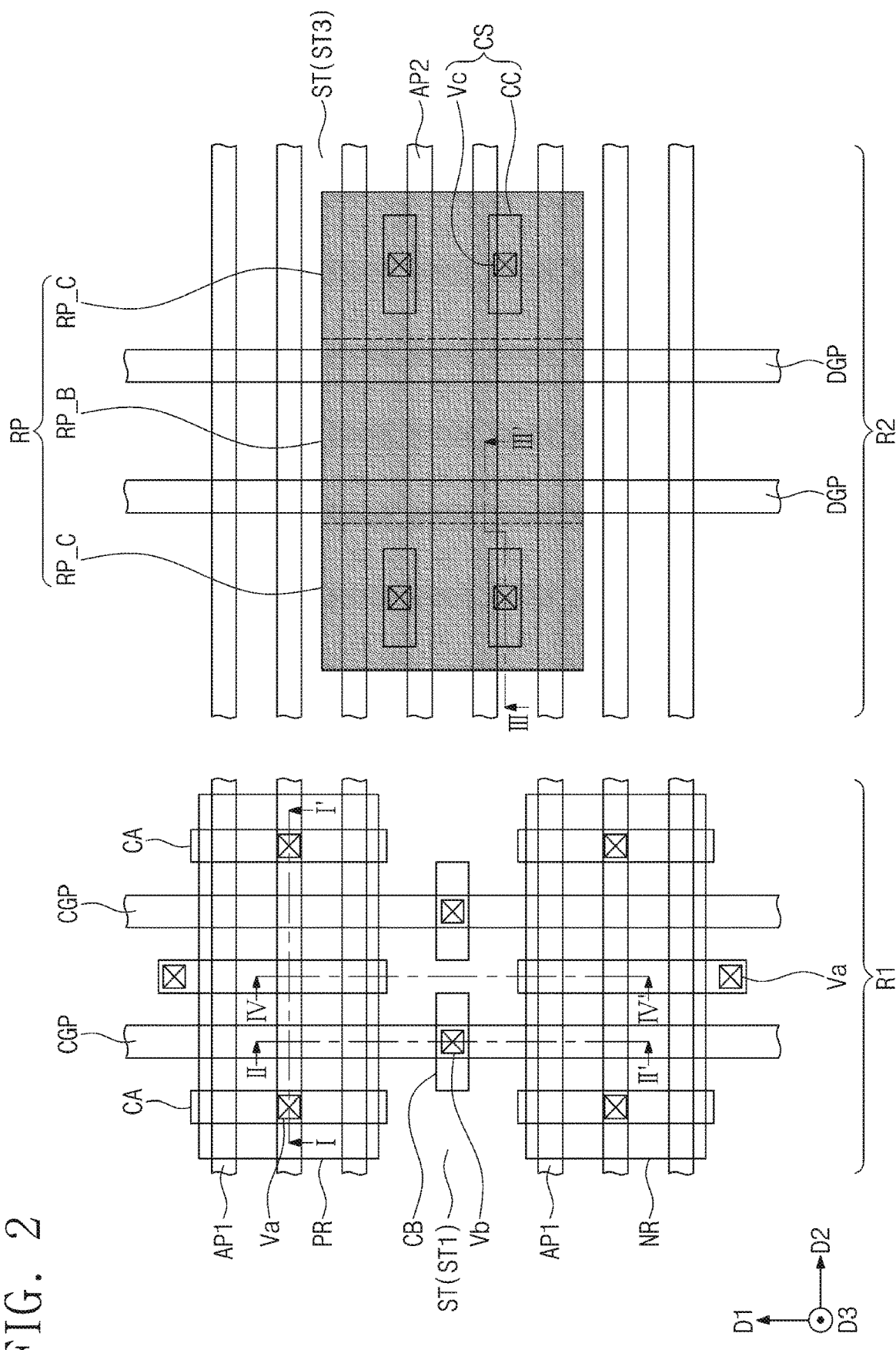
FIG. 2 is a plan view illustrating a semiconductor device according to some example embodiments of inventive concepts.
Figure 3:
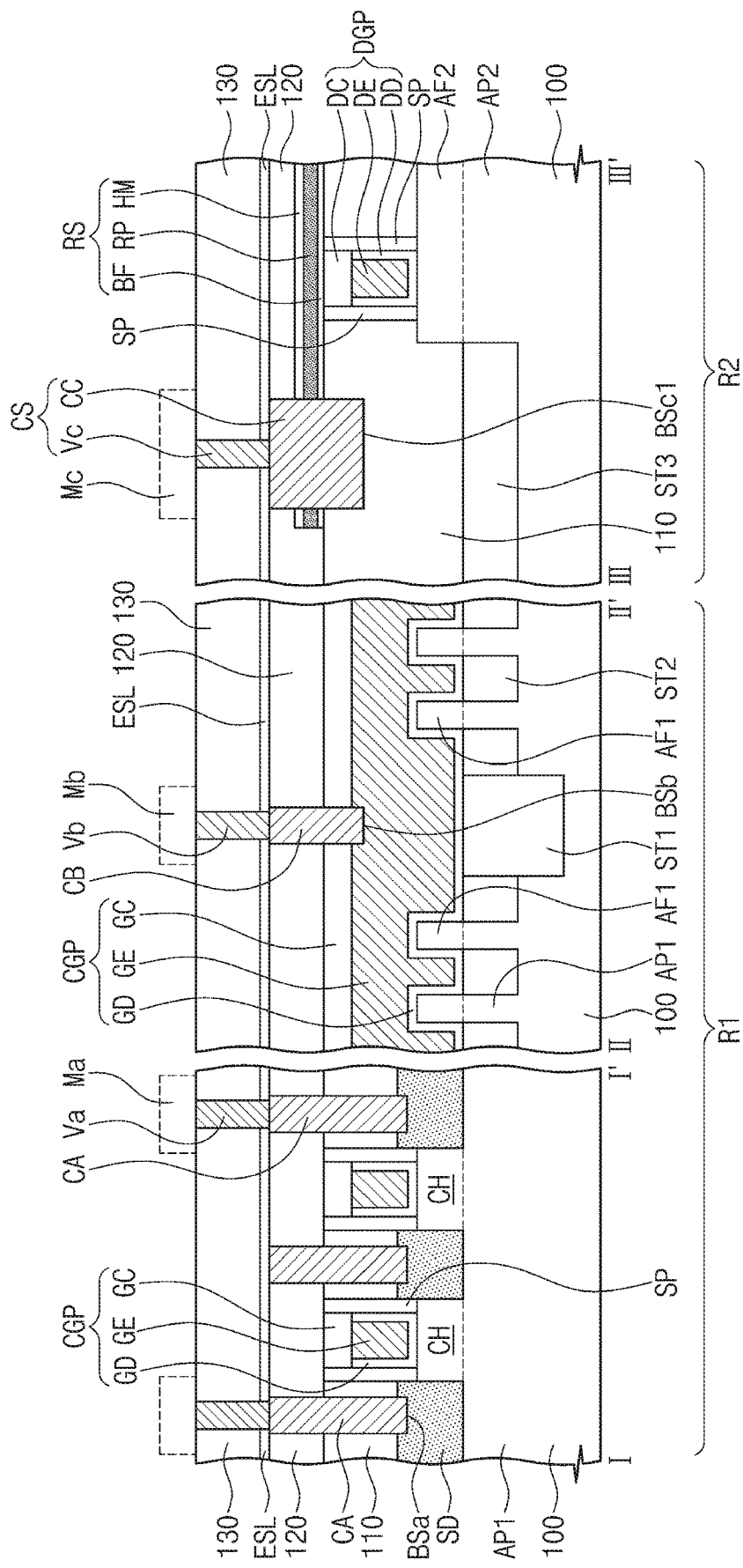
FIG. 3 is a sectional view taken along lines I-I', II-II', and III-III' of FIG. 2.
Figure 4:
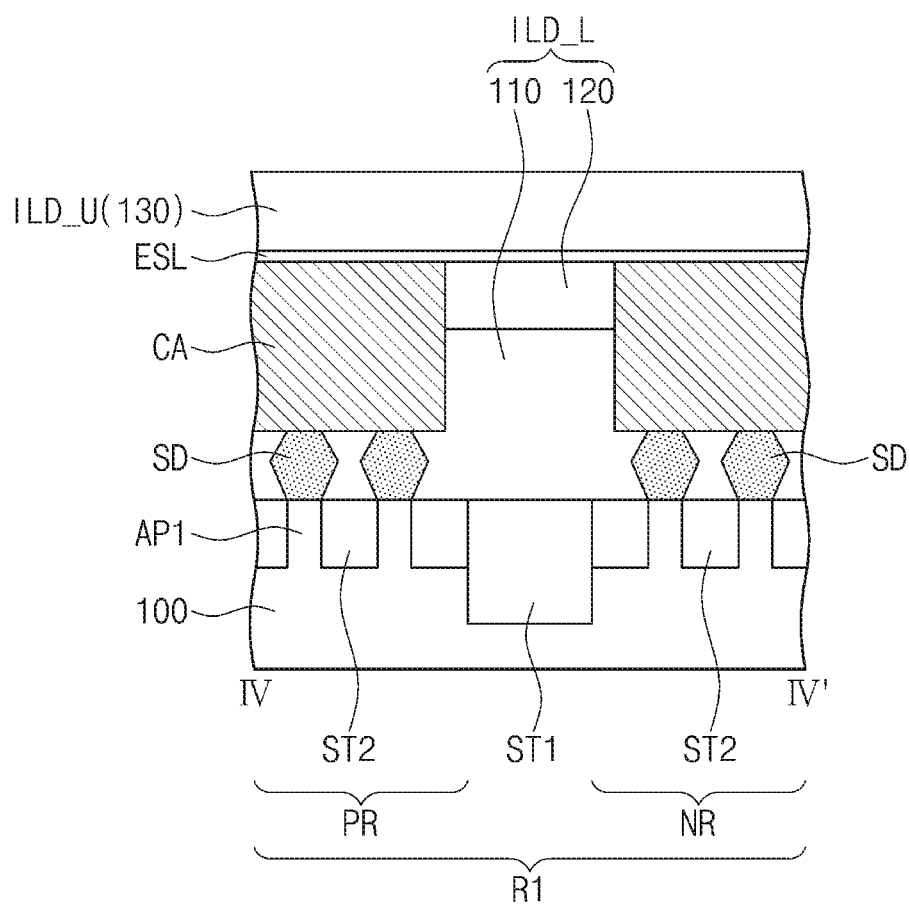
FIG. 4 is a sectional view taken along line IV-IV' of FIG. 2.
Figure 5:
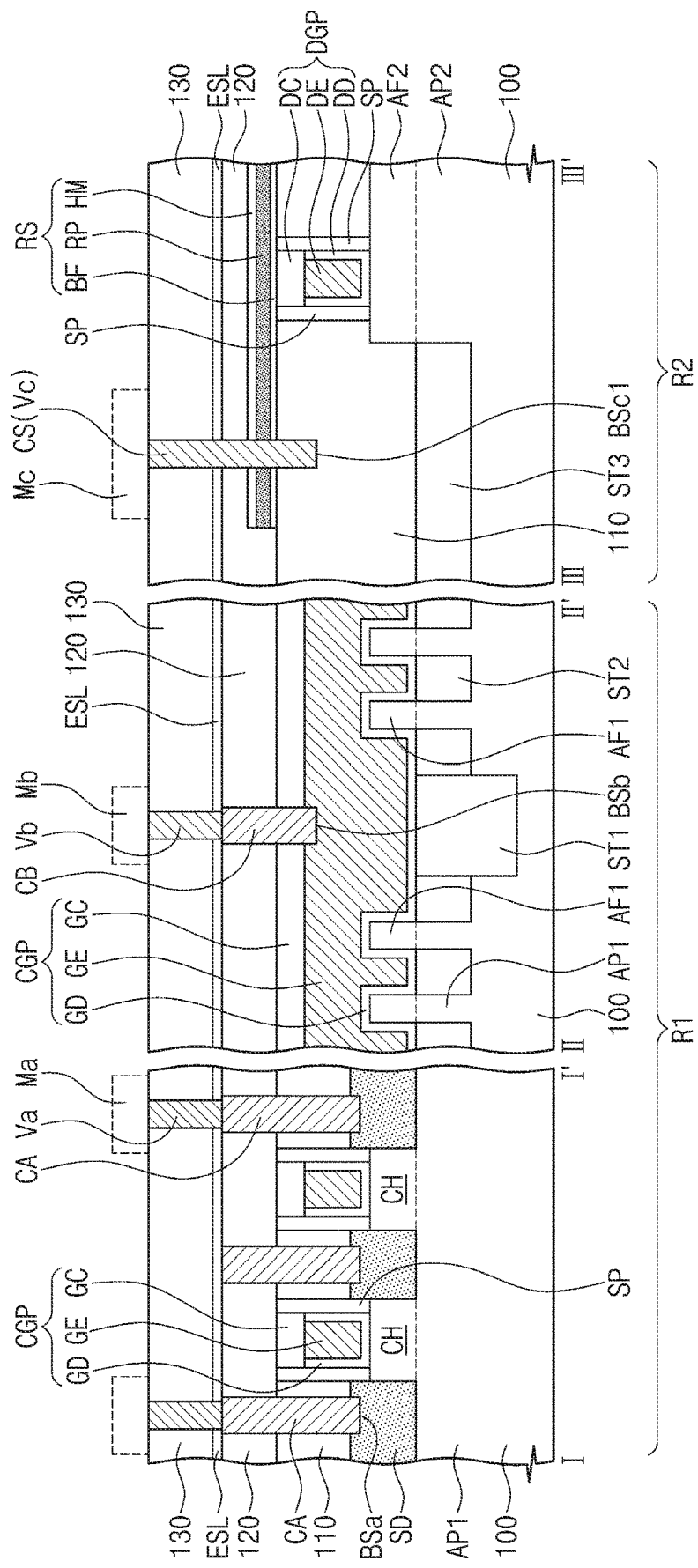
FIG. 5 is a sectional view, which includes vertical sections corresponding to lines I-I', II-II' and III-III' of FIG. 2 and is provided to illustrate a modification of a connection structure of FIG. 2.
Figure 6A:
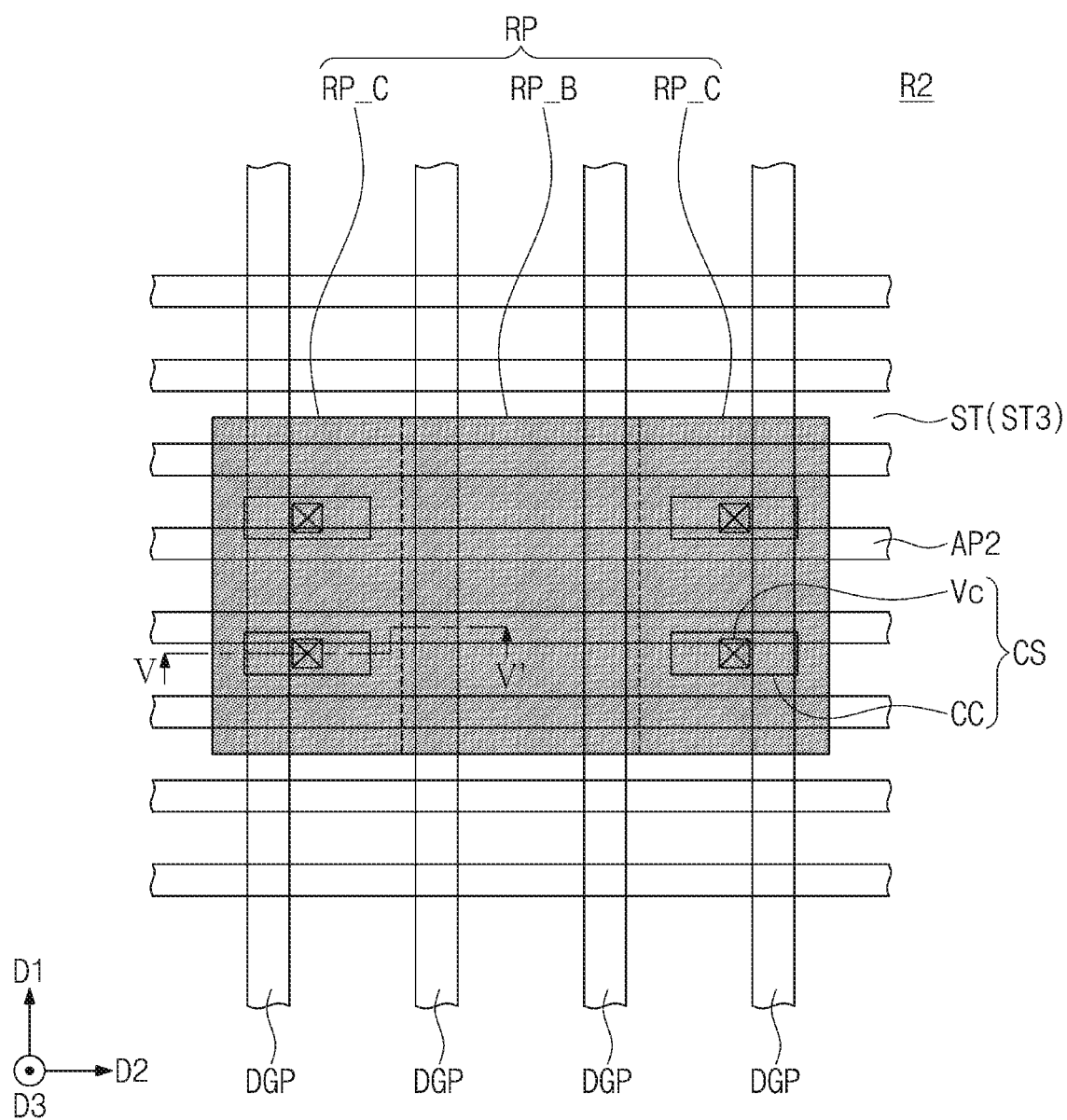
FIG. 6A is a plan view corresponding to a second region of FIG. 2.
Figure 6B:
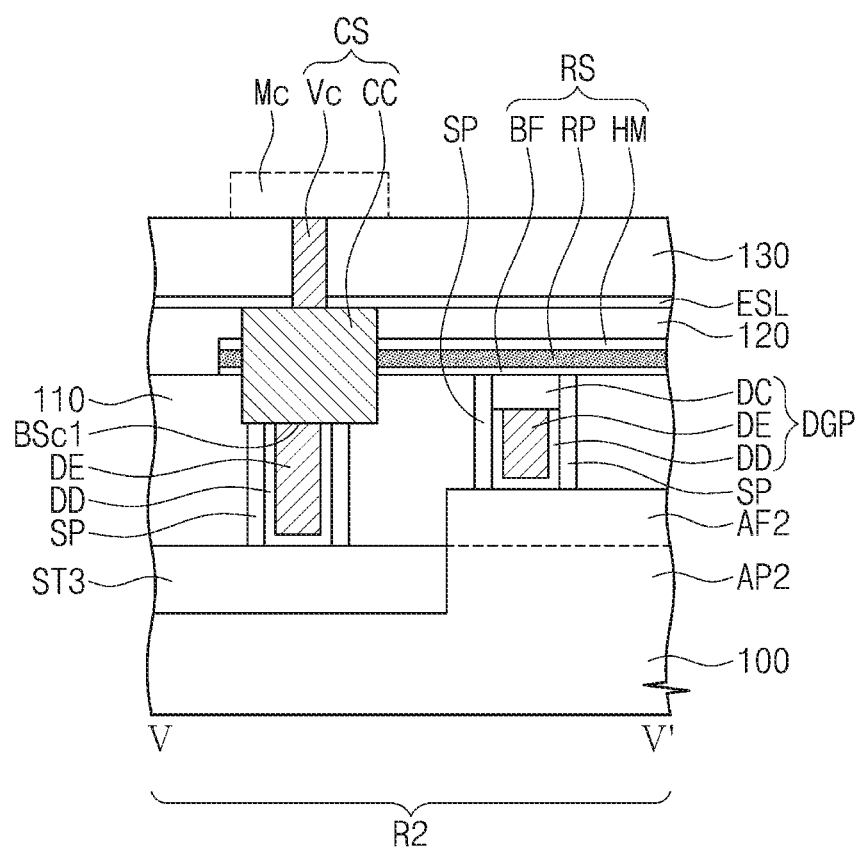
FIG. 6B is a sectional view taken along line V-V' of FIG. 6A.

FIG. 2 is a plan view illustrating a semiconductor device according to some example embodiments of inventive concepts. FIG. 3 is a sectional view taken along lines I-I', II-II', and III-III' of FIG. 2, and FIG. 4 is a sectional view taken along line IV-IV' of FIG. 2. FIG. 5 is a sectional view, which includes vertical sections corresponding to lines I-I', II-II' and III-III' of FIG. 2 and is provided to illustrate a modification of a connection structure of FIG. 2. FIG. 6A is a plan view corresponding to a second region of FIG. 2, and FIG. 6B is a sectional view taken along line V-V' of FIG. 6A.

Referring to FIGS. 2 to 4, a substrate 100 with a first region R1 and a second region R2 may be provided. The substrate 100 may be a semiconductor substrate. In some example embodiments, the substrate 100 may be a silicon substrate, a germanium substrate, or a silicon-on-insulator (SOI) substrate. The first region R1 may be a part of a logic cell region, on which logic transistors constituting a logic circuit of a semiconductor device are formed, or a part of a memory cell region, on which memory cells (e.g., SRAM cells) for storing data are formed. The first region R1 may include, for example, a PMOSFET region PR and an NMOSFET region NR. The PMOSFET region PR may be an active region, on which p-type transistors are provided, and the NMOSFET region NR may be an active region, on which n-type transistors are provided. In some example embodiments, the first region R1 may include a plurality of PMOSFET regions PR and a plurality of NMOSFET regions NR, which are arranged in the first direction D1.

The second region R2 may be a region, on which a passive element is formed. In some example embodiments, the passive element may be a resistor. For example, the second region R2 may be a resistor region provided in an integrated circuit of a semiconductor device.

Active patterns AP1 and AP2 may be provided on each of the first and second regions R1 and R2 of the substrate 100. For example, first active patterns AP1 may be provided on each of the active regions NR and PR of the first region R1. The first active patterns AP1 may be arranged to be spaced apart from each other in the first direction D1 and may have a line-shaped structure extending in the second direction D2 crossing the first direction D1. The first active patterns AP1 of each of the active regions NR and PR may be spaced apart from each other by substantially the same space. The first active patterns AP1 may have a structure protruding from the top surface of the substrate 100 in the third direction D3, which is normal to both of the first and second directions D1 and D2. Each of the first active patterns AP1 may be a portion of the substrate 100 or an epitaxial pattern formed on the substrate 100. Although each of the active regions NR and PR is illustrated to have three first active patterns, inventive concepts are not limited thereto.

Second active patterns AP2 may be provided on the second region R2 of the substrate 100 and may be spaced apart from each other in the first direction D1. Each of the second active patterns AP2 may be a line-shaped structure extending in the second direction D2. The second active patterns AP2 may be spaced apart from each other by substantially the same space and may protrude from the top surface of the substrate 100 in the third direction D3. Each of the second active patterns AP2 may be a portion of the substrate 100 or an epitaxial pattern formed on the substrate 100.

Device isolation patterns ST may be provided on the substrate 100. The device isolation patterns ST may include first and second device isolation patterns ST1 and ST2 disposed on the first region R1 and third device isolation patterns ST3 disposed on the second region R2. The first device isolation pattern ST1 may be provided between the NMOSFET and PMOSFET regions NR and PR and may be used to separate the NMOSFET and PMOSFET regions NR and PR from each other. The second device isolation patterns ST2 may be provided at both sides of the first active patterns AP1 to expose upper portions of the first active patterns AP1. Hereinafter, the exposed upper portions of the first active patterns AP1 may be referred to as first active fins AF1. For example, each of the first active fins AF1 may be a fin-shaped protruding structure which is provided between the second device isolation patterns ST2. The third device isolation patterns ST3 may be provided at both sides of the second active patterns AP2 to expose upper portions of the second active patterns AP2. The exposed upper portions of the second active patterns AP2 may be referred to as second active fins AF2, and each of them may be a fin-shaped protruding structure which is provided between the third device isolation patterns ST3. The first to third device isolation patterns ST1, ST2, and ST3 may be connected to each other, thereby constituting a single insulating layer. For example, each of the first to third device isolation patterns ST1, ST2, and ST3 may be a part of the single insulating layer.

In some example embodiments, the first device isolation pattern ST1 may be thicker than the second and third device isolation patterns ST2 and ST3. For example, top surfaces of the first, second, and third device isolation patterns ST1, ST2, and ST3 may be positioned at substantially the same level, whereas a bottom surface of the first device isolation pattern ST1 may be lower than those of the second and third device isolation patterns ST2 and ST3. In this case, the first device isolation pattern ST1 may be formed by an additional process that is different from that for the second and third device isolation patterns ST2 and ST3. However, inventive concepts are not limited thereto. The first to third device isolation patterns ST1, ST2, and ST3 may be formed of or include, for example, silicon oxide.

On the substrate 100, gate patterns CGP and DGP may be provided to cross the active patterns AP1 and AP2 and extend in the first direction D1. The gate patterns CGP and DGP may include a cell gate pattern CGP disposed on the first region R1 and a dummy gate pattern DGP disposed on the second region R2. The cell gate pattern CGP may cross the first active patterns AP1 and cover top and side surfaces of the first active fins AF1. As an example, the cell gate pattern CGP may extend in the first direction D1 and may cross both of the NMOSFET and PMOSFET regions NR and PR. However, inventive concepts are not limited thereto.

The cell gate pattern CGP may include a plurality of cell gate patterns CGP, which are arranged in the second direction D2.

Each of the cell gate patterns CGP may include a gate insulating pattern GD, a gate electrode GE, and a gate capping pattern GC, which are sequentially stacked on the substrate 100. The gate insulating pattern GD may be formed of or include at least one of a silicon oxide layer, a silicon oxynitride layer, or high-k dielectric layers whose dielectric constants are higher than that of the silicon oxide layer. The gate electrode GE may be formed of or include at least one of conductive metal nitrides (e.g., titanium nitride or tantalum nitride) or metals (e.g., aluminum or tungsten). The gate capping pattern GC may be formed of or include at least one of a silicon oxide layer, a silicon nitride layer, or a silicon oxynitride layer. Gate spacers SP may be provided on side surfaces of the cell gate pattern CGP. The gate spacers SP may be formed of or include at least one of a silicon oxide layer, a silicon nitride layer, or a silicon oxynitride layer. In some example embodiments, the gate insulating pattern GD may extend between each of the gate electrodes GE and the gate spacers SP. Portions of the first active fins AF1, which are positioned below and overlapped with the cell gate patterns CGP, may be used as channel regions CH.

The dummy gate pattern DGP may be provided to extend in the first direction D1 and cross the second active patterns AP2. For example, the dummy gate pattern DGP may be provided to cover top and side surfaces of the second active fins AF2. The dummy gate pattern DGP may include a plurality of the dummy gate patterns DGP, which are arranged in the second direction D2. There may be limitations on the number, lengths, or positions of the dummy gate patterns DGP, as will be described in detail below.

The dummy gate patterns DGP may be provided to have substantially the same structural features as those of the cell gate patterns CGP. For example, each of the dummy gate patterns DGP may include a dummy insulating pattern DD, a dummy gate electrode DE, and a dummy capping pattern DC, which are sequentially stacked on the second region R2 of the substrate 100. The dummy insulating pattern DD, the dummy gate electrode DE, and the dummy capping pattern DC may be formed by the same method as that for the gate insulating pattern GD, the gate electrode GE, and the gate capping pattern GC, and thus, the dummy insulating pattern DD, the dummy gate electrode DE, and the dummy capping pattern DC may respectively be formed of the same materials as those of the gate insulating pattern GD, the gate electrode GE, and the gate capping pattern GC. The gate spacers SP may be provided on side surfaces of the dummy gate patterns DGP.

Source/drain regions SD may be provided on the first active patterns AP1 and at both sides of each of the cell gate patterns CGP. In some example embodiments, as shown in FIG. 3, the source/drain regions SD may be epitaxial patterns which are epitaxially grown using the first active patterns AP1 as a seed layer. In this case, the source/drain regions SD of the PMOSFET region PR may be configured to exert a compressive strain to the channel region CH, and the source/drain regions SD of the NMOSFET region NR may be configured to exert a tensile strain to the channel region CH. As an example, the source/drain regions SD of the PMOSFET region PR may be formed of or include silicon germanium (SiGe), and the source/drain regions SD of the NMOSFET region NR may be formed of or include silicon (Si) or silicon carbide (SiC). In some example embodiments, unlike that shown in FIG. 3, the source/drain regions SD may be impurity regions, which are formed in the first active fins AF1 and at both sides of each of the cell gate pattern CGP. The source/drain regions SD of the PMOSFET region PR may be p-type impurity regions, and the source/drain regions SD of the NMOSFET region NR may be n-type impurity regions. The cell gate patterns CGP and the source/drain regions SD on the first region R1 may constitute cell transistors.

A first interlayer insulating layer 110 may be provided on the substrate 100 to cover the source/drain regions SD and the gate spacers SP. The first interlayer insulating layer 110 may be provided to expose top surfaces of the cell and dummy gate patterns CGP and DGP (e.g., top surfaces of the gate capping pattern GC and the dummy capping pattern DC). For example, the first interlayer insulating layer 110 of the first region R1 may have a top surface that is coplanar with those of the cell gate patterns CGP, and the first interlayer insulating layer 110 of the second region R2 may have a top surface that is coplanar with those of the dummy gate patterns DGP. A second interlayer insulating layer 120 may be provided on the first interlayer insulating layer 110 to cover the top surfaces of the cell and dummy gate patterns CGP and DGP. Each of the first and second interlayer insulating layers 110 and 120 may be formed of or include at least one of a silicon oxide layer or a silicon oxynitride layer. Hereinafter, the first and second interlayer insulating layers 110 and 120 may be referred to as a lower interlayer insulating layer ILD_L.

Source/drain contacts CA may be provided at both sides of each of the cell gate patterns CGP to penetrate the first and second interlayer insulating layers 110 and 120. The source/drain contacts CA may be electrically connected to the source/drain regions SD. Each of the source/drain contacts CA may be singly connected to a corresponding one of the source/drain regions SD or may be connected in common to a plurality of the source/drain regions SD, but inventive concepts are not limited to these examples. Each of the source/drain contacts CA may be a bar-shaped structure extending in the first direction D1, when viewed in a plan view. The source/drain contacts CA may be formed of or include at least one of doped semiconductor materials (e.g., doped poly-silicon), metal nitrides (e.g., titanium nitride, tungsten nitride, or tantalum nitride), or metals (e.g., tungsten, titanium, or tantalum). Although not shown, a metal silicide layer may be interposed between each of the source/drain contacts CA and each of the source/drain regions SD. The metal silicide layer may be formed of or include at least one of, for example, titanium silicide, tantalum silicide, or tungsten silicide.

A gate contact CB may be provided on each of the cell gate patterns CGP and may be electrically connected to the gate electrode GE. The gate contact CB may be provided to penetrate the second interlayer insulating layer 120 and the gate capping pattern GC and may be coupled to the gate electrode GE. The gate contact CB may be formed on the first device isolation pattern ST1 as shown in the drawings, but inventive concepts are not limited thereto. The gate contact CB may be formed of or include the same material as that of the source/drain contacts CA. For example, the gate contact CB may be formed of or include at least one of doped semiconductor materials (e.g., doped poly-silicon), metal nitrides (e.g., titanium nitride, tungsten nitride, or tantalum nitride), or metals (e.g., tungsten, titanium, or tantalum). In some example embodiments, the source/drain and gate contacts CA and CB may have top surfaces, which are positioned at the substantially same level as that of the second interlayer insulating layer 120 of the first region R1. In other words, the top surfaces of the source/drain and gate contacts CA and CB may be coplanar with that of the second interlayer insulating layer 120 of the first region R1. In addition, the source/drain contacts CA may have bottom surfaces BSa that are lower than a bottom surface BSb of the gate contact CB.

A third interlayer insulating layer 130 may be provided on the second interlayer insulating layer 120, and an etch stop layer ESL may be provided between the second and third interlayer insulating layers 120 and 130. The etch stop layer ESL may be formed of or include at least one of silicon nitride, silicon carbonitride, or aluminum nitride. The third interlayer insulating layer 130 may be formed of or include at least one of a silicon oxide layer, a silicon oxynitride layer, a silicon nitride layer, or low-k dielectric materials whose dielectric constants are lower than that of the silicon oxide layer. Hereinafter, the third interlayer insulating layer 130 may be referred to as an upper interlayer insulating layer ILD_U.

First and second interconnection lines Ma and Mb may be provided on the third interlayer insulating layer 130 of the first region R1 and may be electrically connected to the source/drain contacts CA or the gate contact CB. For example, each of the first interconnection lines Ma may be electrically connected to a corresponding one of the source/drain contacts CA through a first via Va, which is formed on the first region R1 to penetrate the third interlayer insulating layer 130 and the etch stop layer ESL. Each of the second interconnection lines Mb may be electrically connected to a corresponding one of the gate contacts CB through a second via Vb, which is formed on the first region R1 to penetrate the third interlayer insulating layer 130 and the etch stop layer ESL. Together, the gate contact CB and second via Vb may be referred to as a gate interconnect structure. Accordingly, the first interconnection line Ma may be used to apply a voltage to one of the source/drain regions SD through the first via Va and the source/drain contact CA, and the second interconnection line Mb may be used to apply a voltage to one of the gate electrodes GE through the second via Vb and the gate contact CB. The first and second vias Va and Vb and the first and second interconnection lines Ma and Mb may be formed of or include a metal material (e.g., copper).

In some example embodiments, the resistor pattern RP may be provided on the first interlayer insulating layer 110 of the second region R2. As shown, the resistor pattern RP may be provided in or below the second interlayer insulating layer 120 of the second region R2. The resistor pattern RP may be provided to have a plate shape, but inventive concepts are not limited thereto.

In some example embodiments, when viewed in a plan view, the resistor pattern RP may have a rectangular shape which is elongated in the extension or longitudinal direction of the second active patterns AP2 (e.g., in the arrangement direction of the dummy gate patterns DGP or in the second direction D2). For example, as shown in FIG. 2, the resistor pattern RP may include the body region RP_B and the connection regions RP_C, which are respectively extended from both end portions of the body region RP_B. In other words, the connection regions RP_C may be spaced apart from each other in the second direction D2 (e.g., the extension or longitudinal direction of the resistor pattern RP) with the body region RP_B interposed therebetween. The body region RP_B may be overlapped with the dummy gate patterns DGP. For example, the dummy gate patterns DGP may be provided below the body region RP_B. By contrast, the dummy gate patterns DGP may not be provided below the connection regions RP_C. In the present example, the resistor pattern RP and the dummy gate patterns DGP may be arranged in substantially the same manner as that of FIG. 1A. In some example embodiments, the resistor pattern RP and the dummy gate patterns DGP may be arranged in the same manner as that of FIG. 1B. As shown in FIG. 2, a pair of the dummy gate patterns DGP may be provided below the body region RP_B, but inventive concepts are not limited thereto. The number of the dummy gate pattern DGP may vary depending on a length, in the second direction D2, of the body region RP_B. In other words, the longer the length, in the second direction D2, of the body region RP_B is, the more dummy gate patterns DGP there may be.

The resistor pattern RP may be formed of or include at least one of metals or metal compounds. For example, the resistor pattern RP may include at least one of tungsten, titanium, tantalum, or compounds thereof. In some example embodiments, the resistor pattern RP may include a titanium nitride layer. In this case, the resistor pattern RP may have a relatively low resistivity, when compared with the case that it is formed of tungsten silicide, and thus, it is possible to realize the resistor pattern RP with a small thickness.

A buffer insulating pattern BF may be provided between the resistor pattern RP and the first interlayer insulating layer 110, and a hard mask pattern HM may be provided on the top surface of the resistor pattern RP. When viewed in a plan view, the buffer insulating pattern BF and the hard mask pattern HM may have substantially the same shape as the resistor pattern RP. The buffer insulating pattern BF may include, for example, a silicon oxide layer, and the hard mask pattern HM may include a silicon nitride layer or a silicon oxynitride layer. The buffer insulating pattern BF, the resistor pattern RP, and the hard mask pattern HM, which are sequentially stacked, may be referred to as a resistor structure RS. In some example embodiments, the buffer insulating pattern BF and/or the hard mask pattern HM may be omitted.

The connection structure CS may be provided on each of the connection regions RP_C. The connection structure CS may be used to electrically connect one of third interconnection lines Mc, which are provided on the third interlayer insulating layer 130 of the second region R2, to the resistor pattern RP. The connection structure CS may include the lower contact CC and at least one connection via Vc provided on the lower contact CC. The lower contact CC may be provided in the second interlayer insulating layer 120 of the second region R2 and may be coupled to the connection region RP_C of the resistor pattern RP. In some example embodiments, the lower contact CC may have a structure completely penetrating the resistor structure RS. For example, the lower contact CC may be provided to penetrate the second interlayer insulating layer 120 and the resistor structure RS and moreover to include a portion inserted into the first interlayer insulating layer 110. Accordingly, the lower contact CC may have side surfaces which are in direct contact with the resistor pattern RP. When viewed in a plan view, the lower contact CC may be a bar-shaped structure extending in the second direction D2 or crossing the dummy gate pattern DGP, but inventive concepts are not limited thereto.

In some example embodiments, a lower contact hole, in which the lower contact CC is provided, may be formed at the same time as a gate contact hole, in which the gate contact CB is provided. Accordingly, a bottom surface BSc1 of the lower contact CC may be formed at a level corresponding to the bottom surface BSb of the gate contact CB, as shown in FIG. 3.

The connection via Vc may be provided on the lower contact CC. The connection via Vc may be provided on the second region R2 to penetrate the third interlayer insulating layer 130 and the etch stop layer ESL and to be coupled to the lower contact CC. Accordingly, each of the third interconnection lines Mc may be electrically connected to one of the connection regions RP_C of the resistor pattern RP through the connection structure CS. In some example embodiments, a plurality of the connection vias Vc may be provided on each lower contact CC. The plurality of the connection vias Vc provided on each lower contact CC may be connected in common to a corresponding one of the third interconnection lines Mc. Furthermore, a plurality of the connection structures CS may be provided on each connection region RP_C. The plurality of the connection structures CS provided on each connection region RP_C may be connected in common to a corresponding one of the third interconnection lines Mc. The connection via Vc may be formed of or include the same material as that of the first and second vias Va and Vb, and the third interconnection line Mc may be formed of or include the same material as that of the first and second interconnection lines Ma and Mb.

In some example embodiments, as shown in FIG. 5, the lower contact CC may be omitted. For example, the connection structure CS may be configured to have only the connection via Vc. Here, the connection via Vc may be provided to completely penetrate the resistor pattern RP in a vertical direction, thereby extending beyond the bottom surface of the resistor pattern RP.

The dummy gate patterns DGP on the second region R2 may contribute to reduce a difference in pattern density and height between the first region R1 and the second region R2. According to the conventional method, the dummy gate patterns DGP may be provided below the connection regions RP_C of the resistor pattern RP. In this case, as shown in FIGS. 6A and 6B, if a portion of the connection structure CS (e.g., a lower portion of the lower contact CC) is formed to penetrate the resistor pattern RP or is extended into the first interlayer insulating layer 110, it may be undesirably coupled to the dummy gate electrode DE; for example, a short circuit may be formed between the connection structure CS and the dummy gate pattern DGP. This may lead to a difficulty in stably controlling resistance values of the resistor patterns RP. By contrast, according to some example embodiments of inventive concepts, the dummy gate patterns DGP may not be provided below the connection regions RP_C of the resistor pattern RP, and thus, the lower contact CC may be limited and/or prevented from being undesirably coupled to the dummy gate electrode DE. Accordingly, it is possible to reduce a variation in resistance of the resistor pattern RP and thereby to increase reliability of a semiconductor device.

Figure 7A:
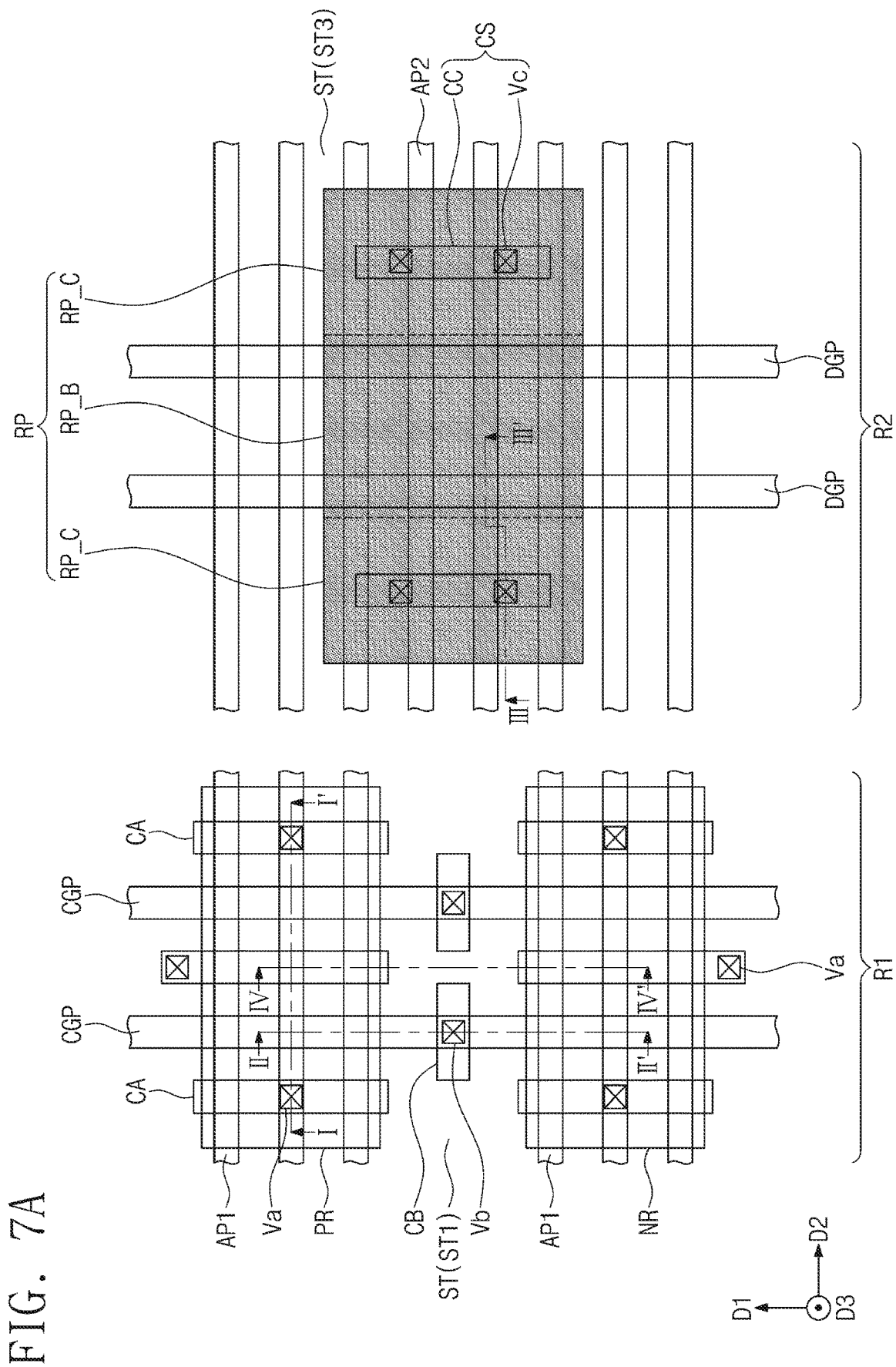
FIG. 7A is a plan view illustrating a semiconductor device according to some example embodiments of inventive concepts.
Figure 7B:
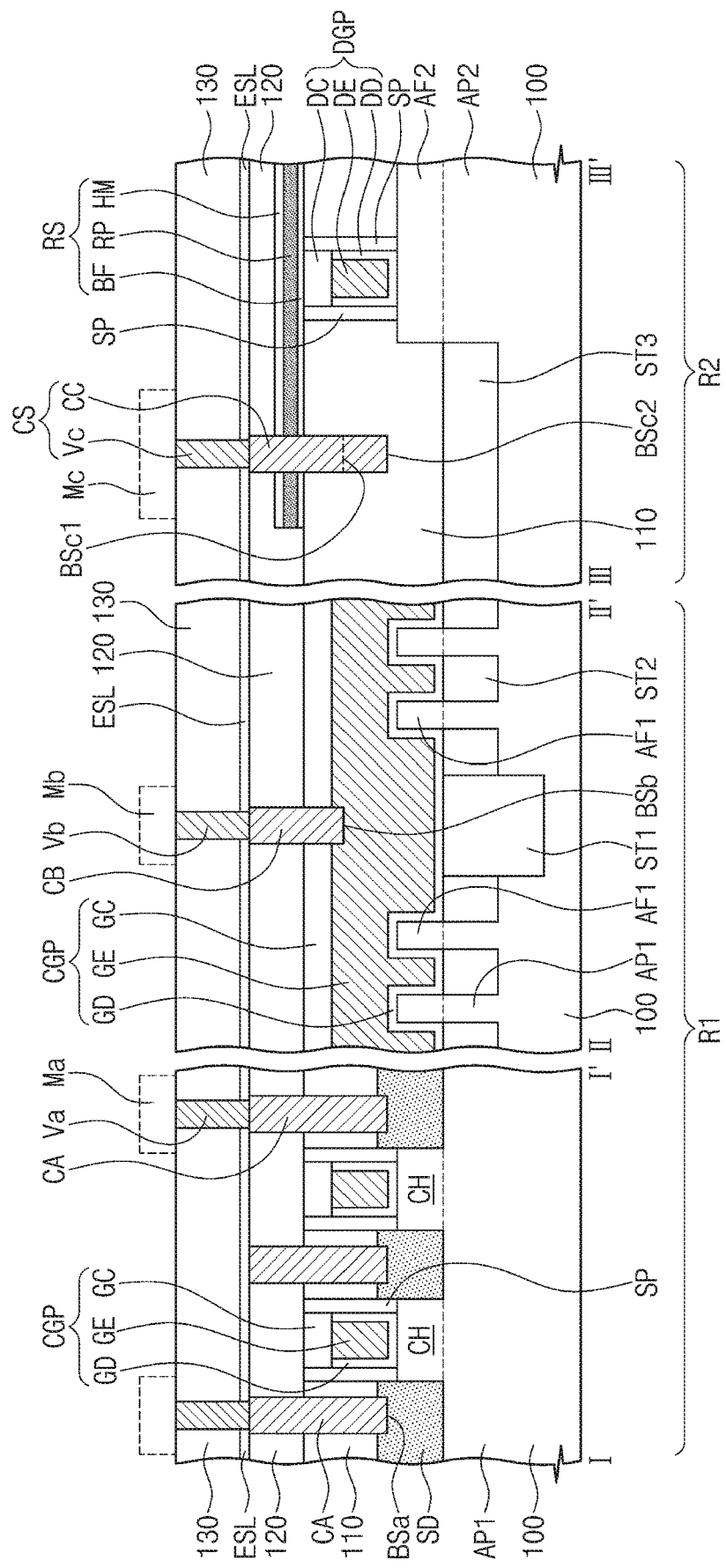
FIG. 7B is a sectional view taken along lines I-I', II-II', and III-III' of FIG. 7A.

FIG. 7A is a plan view illustrating a semiconductor device according to some example embodiments of inventive concepts, and FIG. 7B is a sectional view taken along lines I-I', II-II', and III-III' of FIG. 7A. Except for features associated with the connection structure, the semiconductor device may be configured to have substantially the same features as those described with reference to FIGS. 2 to 4. For the sake of brevity, the elements and features of this example that are similar to those previously shown and described will not be described in much further detail.

Referring to FIGS. 7A and 7B, the lower contact CC may be a bar-shaped structure extending in the first direction D1 or parallel to the dummy gate pattern DGP. One or more connection vias Vc may be provided on each of the lower contacts CC. A lower contact hole, in which the lower contact CC is provided, may be formed at the same time as a source/drain contact hole, in which the source/drain contact CA is provided. Accordingly, a bottom surface BSc2 of the lower contact CC may be formed at a level corresponding to the bottom surface BSa of the source/drain contact CA, as shown in FIG. 7B. In this case, the bottom surface BSc2 of the lower contact CC may be higher than the bottom surface BSa of the source/drain contact CA and may be lower than the bottom surface BSb of the gate contact CB. Other features may be substantially the same as those described with reference to FIGS. 2 to 4, and thus, detailed description thereof will be omitted.

FIG. 8A is a plan view illustrating a semiconductor device according to some example embodiments of inventive concepts, and FIG. 8B is a sectional view taken along lines I-I', II-II', and III-III' of FIG. 8A. Except for features associated with the dummy gate patterns, the semiconductor device may be configured to have substantially the same features as those described with reference to FIGS. 2 to 4. For the sake of brevity, the elements and features of this example that are similar to those previously shown and described will not be described in much further detail.

Referring to FIGS. 8A and 8B, the dummy gate patterns DGP may be provided on a field isolation region (e.g., the third device isolation patterns ST3). For example, the second active patterns AP2 of the second region R2 may be omitted. In this case, the third device isolation patterns ST3 may have a thickness that is substantially equal to that of the first device isolation pattern ST1 and is greater than that of the second device isolation patterns ST2. Other features may be substantially the same as those of described with reference to FIGS. 2 to 4, and thus, detailed description thereof will be omitted.

Figure 9:
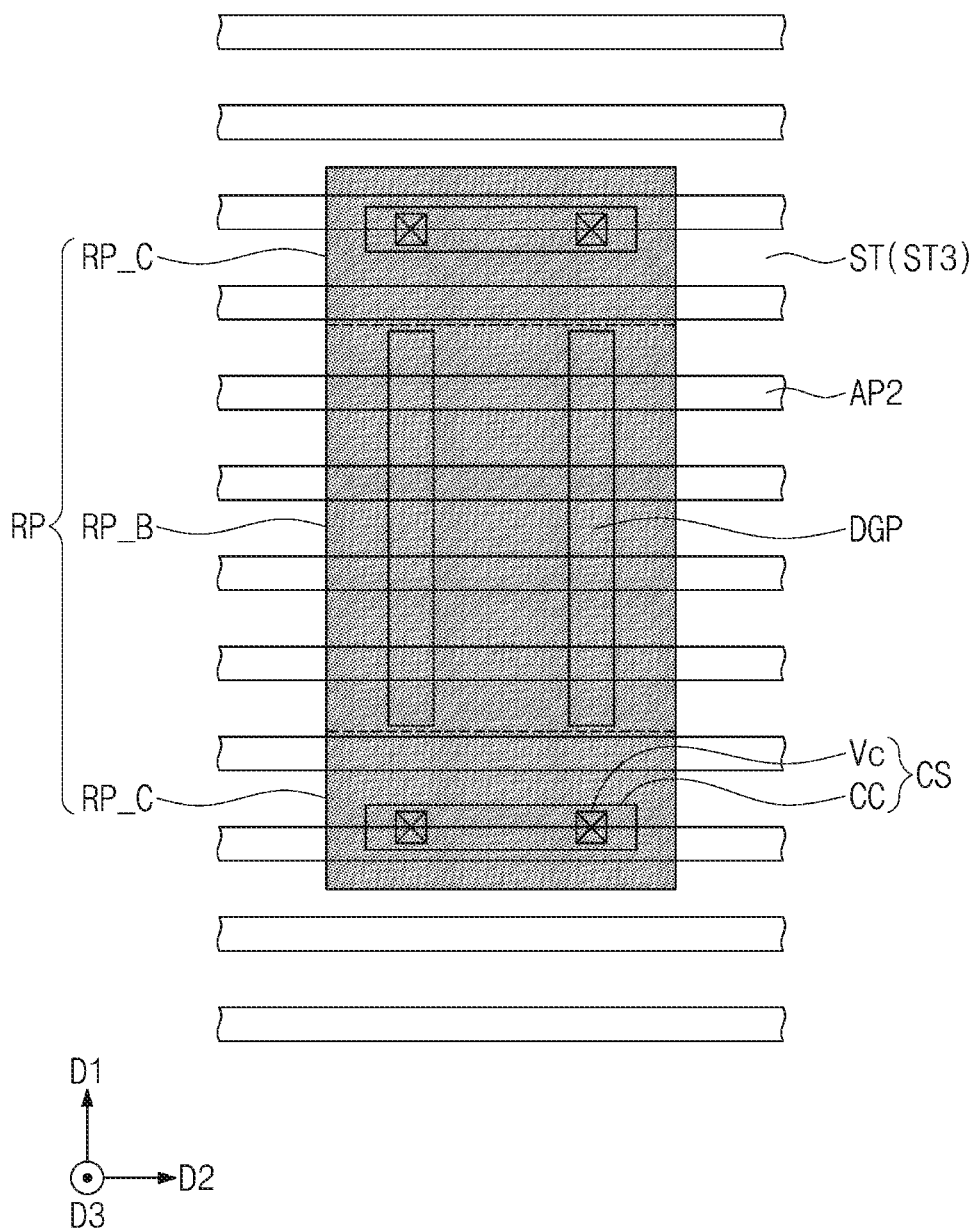
FIG. 9 is a plan view corresponding to a second region of FIG. 2.

FIG. 9 is a plan view corresponding to a second region of FIG. 2. The first region R1 may be configured to have substantially the same features as those of described with reference to FIGS. 2 to 4. By contrast, the second region R2 may be configured in such a way that the resistor pattern and the dummy gate patterns are arranged in a manner different from the those described with reference to FIGS. 2 to 4. For the sake of brevity, the elements and features of this example that are similar to those previously shown and described will not be described in much further detail.

Referring to FIG. 9, when viewed in a plan view, the resistor pattern RP may have a rectangular shape which is elongated in the arrangement direction of the second active patterns AP2 (e.g., in the extension or longitudinal direction of the dummy gate pattern DGP or in the first direction D1). The connection regions RP_C may be spaced apart from each other in the first direction D1 with the body region RP_B interposed therebetween. The connection structures CS may be respectively provided on the connection regions RP_C and may be spaced apart from each other in the first direction D1. Each of the connection structures CS may include a lower contact CC and one or more connection vias Vc, which are provided on the lower contact CC.

The dummy gate patterns DGP may be provided below the body region RP_B, but not below the connection regions RP_C. In the present example, the resistor pattern RP and the dummy gate patterns DGP may be arranged in substantially the same manner as that of FIG. 1C. In some example embodiments, the resistor pattern RP and the dummy gate patterns DGP may be arranged in the same manner as that of FIG. 1D. The number of the dummy gate patterns DGP may be limited by a width, in the second direction D2, of the body region RP_B, and a length of each of the dummy gate patterns DGP may be limited by a length, in the first direction D1, of the body region RP_B. Each of the dummy gate patterns DGP may be a bar-shaped structure extending in the first direction D1.

FIGS. 10 to 13 are sectional views, which include vertical sections corresponding to lines I-I', II-II', and III-III' of FIG. 2 and are provided to illustrate a method of fabricating a semiconductor device according to some example embodiments of inventive concepts. For concise description, a previously described element may be identified by a similar or identical reference number without repeating an overlapping description thereof.

Figure 10:
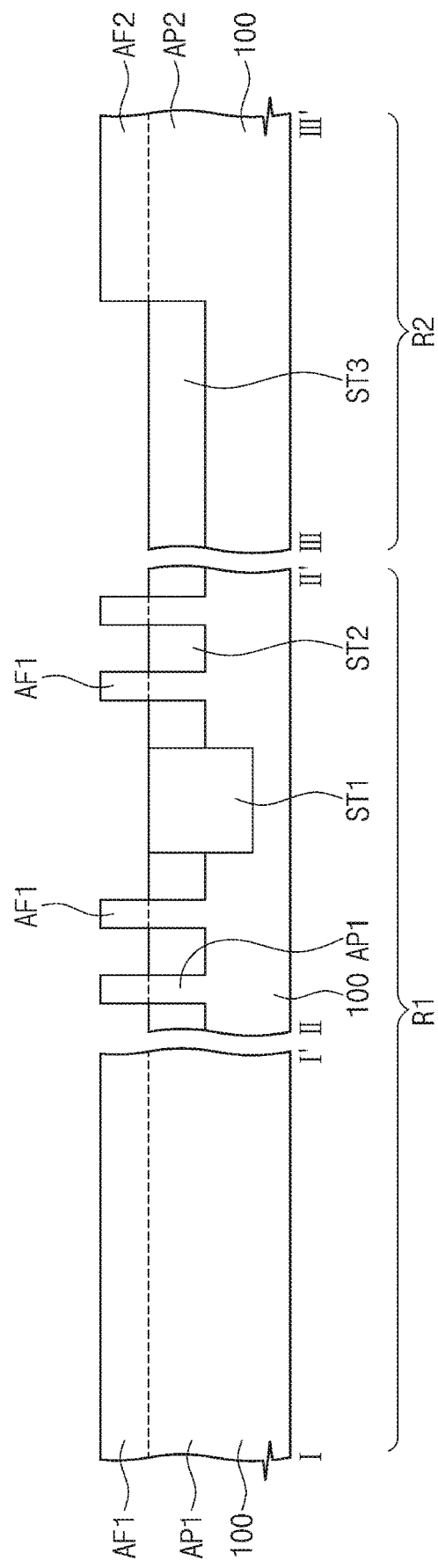
FIGS. 10 to 13 are sectional views, which include vertical sections corresponding to lines I-I', II-II', and III-III' of FIG. 2 and are provided to illustrate a method of fabricating a semiconductor device according to some example embodiments of inventive concepts.

Referring to FIGS. 2 and 10, the substrate 100 with the first region R1 and the second region R2 may be provided. The substrate 100 may be a semiconductor substrate. The first region R1 may be a part of a logic cell region or a part of a memory cell region. The second region R2 may be a region, on which a passive element is formed. In some example embodiments, the passive element may be a resistor. For example, the second region R2 may be a resistor region provided in an integrated circuit of a semiconductor device.

The first active patterns AP1 may be formed on the first region R1 of the substrate 100, and the second active patterns AP2 may be formed on the second region R2 of the substrate 100. The first and second active patterns AP1 and AP2 may be arranged in the first direction D1, and each of them may be formed to have a line-shaped structure extending in the second direction D2. In some example embodiments, the first and second active patterns AP1 and AP2 may be formed by patterning an upper portion of the substrate 100. In some example embodiments, the first and second active patterns AP1 and AP2 may be formed by forming an epitaxial layer on the substrate 100 and patterning the epitaxial layer. Each of the first and second active patterns AP1 and AP2 may include a fin-shaped portion protruding from the top surface of the substrate 100 in the third direction D3.

The first and second device isolation patterns ST1 and ST2 may be formed on the first region R1 of the substrate 100. The first device isolation pattern ST1 may be formed to separate the PMOSFET region PR from the NMOSFET region NR in the first direction D1. For example, some of the first active patterns AP1 may constitute the PMOSFET region PR, and the others may constitute the NMOSFET region NR. The second device isolation patterns ST2 may be formed to expose upper portions of the first active patterns AP1, and the exposed upper portions of the first active patterns AP1 may be used as the first active fins AF1. The third device isolation patterns ST3 may be formed on the second region R2 of the substrate 100. The third device isolation patterns ST3 may be formed to expose upper portions of the second active patterns AP2, and the exposed upper portions of the second active patterns AP2 may be used as the second active fins AF2. The first device isolation pattern ST1 may be formed to be thicker than the second and third device isolation patterns ST2 and ST3. In this case, the first device isolation pattern ST1 may be formed by an additional process that is different from that for the second and third device isolation patterns ST2 and ST3. The additional process may include removing dummy active patterns (e.g., portions of the first active patterns AP1) between the PMOSFET and NMOSFET regions PR and NR to form a trench and filling the trench with an insulating layer.

In some example embodiments, the second active patterns AP2 may be removed, unlike that illustrated in FIG. 10. For example, the removal of the second active patterns AP2 may be performed at the same time as the removal of the dummy active patterns. In this case, as described with reference to FIGS. 8A and 8B, the third device isolation patterns ST3 may be formed to have a thickness that is substantially equal to that of the first device isolation pattern ST1 and is greater than that of the second device isolation patterns ST2.

Figure 11:
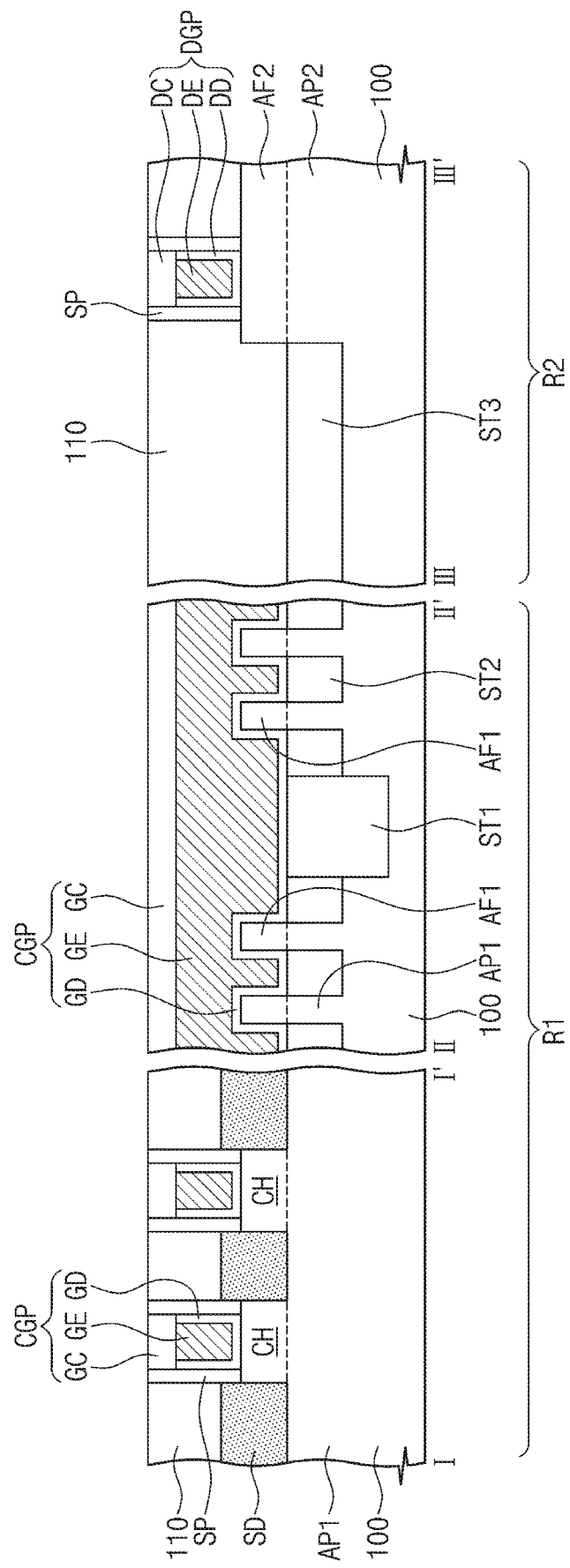

Referring to FIGS. 2 and 11, the cell gate patterns CGP may be formed on the first region R1 of the substrate 100 to cross the first active patterns AP1 or to extend in the first direction D1, and the dummy gate patterns DGP may be formed on the second region R2 of the substrate 100 to cross the second active patterns AP2 or to extend in the first direction D1.

Each of the cell gate patterns CGP may include the gate insulating pattern GD, the gate electrode GE, and the gate capping pattern GC, which are sequentially stacked on the first region R1 of the substrate 100. The gate insulating pattern GD may be formed of or include at least one of a silicon oxide layer, a silicon oxynitride layer, or high-k dielectric layers whose dielectric constants are higher than that of the silicon oxide layer. The gate electrode GE may be formed of or include at least one of conductive metal nitrides (e.g., titanium nitride or tantalum nitride) or metals (e.g., aluminum or tungsten). The gate capping pattern GC may be formed of or include at least one of a silicon oxide layer, a silicon nitride layer, or a silicon oxynitride layer. In some example embodiments, the cell gate pattern CGP may be formed by a gate last process, in which a sacrificial gate pattern is used. For example, the formation of the cell gate pattern CGP may include forming a sacrificial gate pattern (not shown) to cross the first active patterns AP1, forming the gate spacers SP on both side surfaces of the sacrificial gate pattern (not shown), removing the sacrificial gate pattern (not shown) to define a gate region exposing the first active patterns AP1 between the gate spacers SP, and sequentially forming the gate insulating pattern GD, the gate electrode GE, and the gate capping pattern GC in the gate region.

The dummy gate patterns DGP and the cell gate patterns CGP may be formed by substantially the same method and may be formed of substantially the same material. Thus, the dummy gate patterns DGP may be formed to have substantially the same structural features as those of the cell gate patterns CGP. For example, each of the dummy gate patterns DGP may include the dummy insulating pattern DD, the dummy gate electrode DE and the dummy capping pattern DC, which are sequentially stacked on the second region R2 of the substrate 100. The dummy insulating pattern DD, the dummy gate electrode DE, and the dummy capping pattern DC may be formed of the same materials as those of the gate insulating pattern GD, the gate electrode GE, and the gate capping pattern GC, respectively. According to some example embodiments of inventive concepts, the number, lengths, and/or positions of the dummy gate patterns DGP may be changed in consideration of the structure of resistor pattern RP that will be formed in a subsequent process.

The source/drain regions SD may be formed on the first active patterns AP1 and at both sides of the cell gate patterns CGP. In some example embodiments, the source/drain regions SD may be formed to exert a compressive or tensile strain to the channel regions CH below the cell gate patterns CGP. For example, the formation of the source/drain regions SD may include removing upper portions of the first active patterns AP1 (e.g., portions of the first active fins AF1), which are positioned at both sides of the sacrificial gate pattern (not shown), and performing a selective epitaxial growth process using the first active patterns AP1, of which the upper portions are removed, as a seed layer. In this case, the source/drain regions SD of the PMOSFET region PR may be formed to exert a compressive strain to the channel regions CH, and the source/drain regions SD of the NMOSFET region NR may be formed to exert a tensile strain to the channel regions CH. As an example, the source/drain regions SD of the PMOSFET region PR may be formed of silicon germanium (SiGe), and the source/drain regions SD of the NMOSFET region NR may be formed of silicon carbide (SiC). The source/drain regions SD may be doped with impurities, during or after the epitaxial growth process. For example, the source/drain regions SD of the PMOSFET region PR may be doped with p-type impurities, and the source/drain regions SD of the NMOSFET region NR may be doped with n-type impurities.

The first interlayer insulating layer 110 may be formed on the substrate 100 to cover the tops surfaces of the source/drain regions SD and the side surfaces of the gate spacers SP. The first interlayer insulating layer 110 of the first region R1 may be formed to expose the top surfaces of the cell gate patterns CGP, and the first interlayer insulating layer 110 of the second region R2 may be formed to expose the top surfaces of the dummy gate patterns DGP. For example, the top surface of the first interlayer insulating layer 110 of the first region R1 may be formed to be coplanar with those of the cell gate patterns CGP, and the top surface of the first interlayer insulating layer 110 of the second region R2 may be formed to be coplanar with those of the dummy gate patterns DGP. The first interlayer insulating layer 110 may be formed of or include at least one of a silicon oxide layer or a silicon oxynitride layer.

Figure 12:
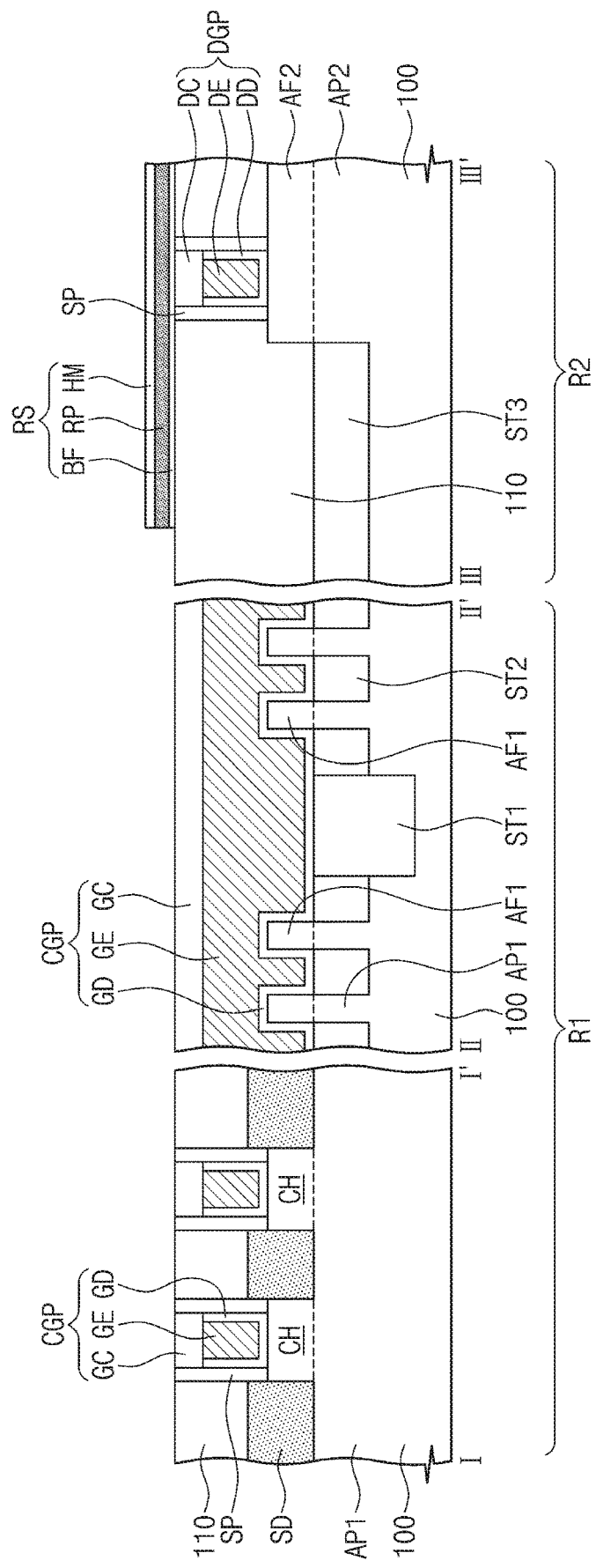

Referring to FIGS. 2 and 12, the resistor structure RS may be formed on the first interlayer insulating layer 110 of the second region R2. The resistor structure RS may include the buffer insulating pattern BF, the resistor pattern RP, and the hard mask pattern HM, which are sequentially stacked on the first interlayer insulating layer 110. In some example embodiments, the resistor structure RS may be formed by sequentially forming a buffer insulating layer, a resistive layer, and a hard mask layer on the first interlayer insulating layer 110 of the second region R2 and then patterning them. As an example, the buffer insulating layer may be formed of or include a silicon oxide layer, and the hard mask layer may be formed of or include a silicon nitride layer or a silicon oxynitride layer. The resistive layer may be formed of or include at least one of metals or metal compounds. For example, the resistive layer may include at least one of tungsten, titanium, tantalum, or compounds thereof. In some example embodiments, the resistive layer may be formed of a titanium nitride layer. In this case, the resistive layer may be formed to have a relatively small thickness, because of its low resistivity. For example, the resistive layer may be formed to have a thickness of about 50 Å. In some example embodiments, at least one of the buffer insulating pattern BF and the hard mask pattern HM may be omitted.

The resistor structure RS may be formed to have a plate shape, but inventive concepts are not limited thereto. The shape of the resistor structure RS (in particular, the resistor pattern RP) and the arrangement between the resistor pattern RP and the dummy gate patterns DGP have been described with reference to FIGS. 2 to 4, and thus, an overlapping description thereof will be omitted.

Figure 13:
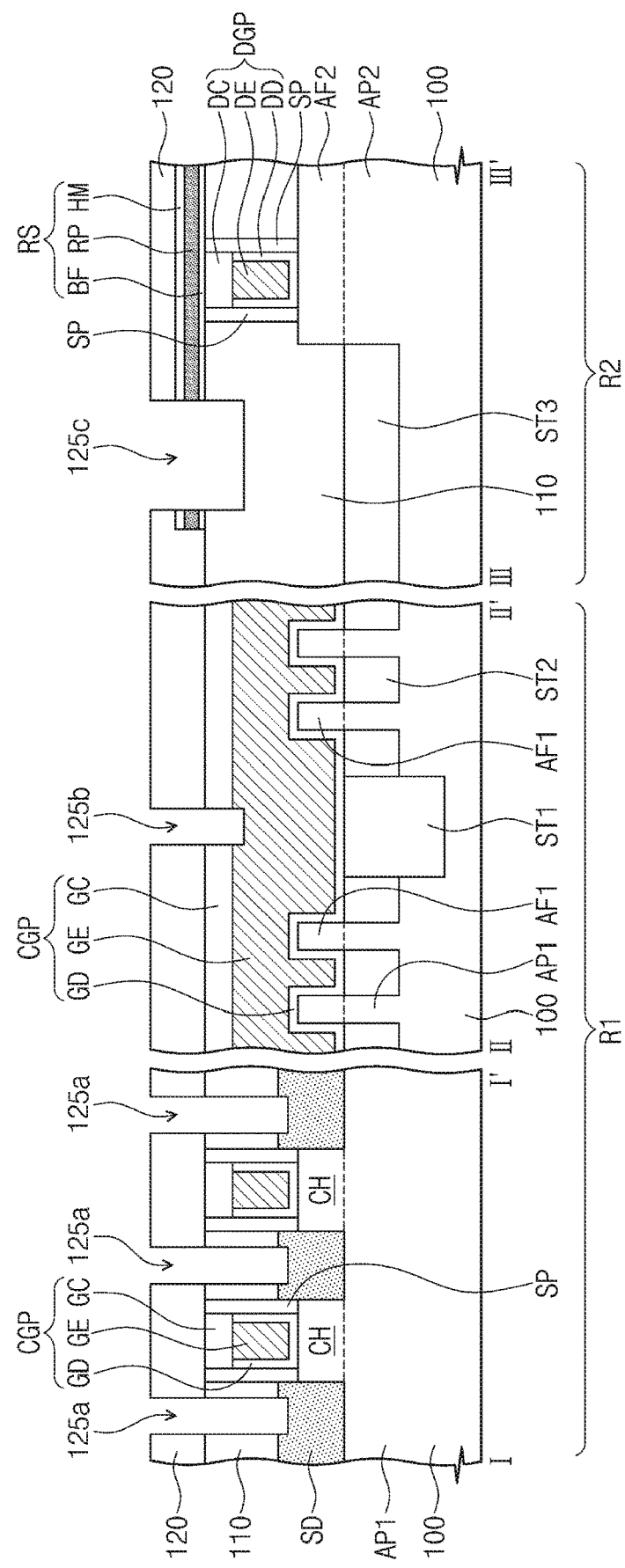

Referring to FIGS. 2 and 13, the second interlayer insulating layer 120 may be formed on the first interlayer insulating layer 110. The second interlayer insulating layer 120 of the first region R1 may be formed to cover the top surfaces of the cell gate patterns CGP, and the second interlayer insulating layer 120 of the second region R2 may be formed to cover the resistor structure RS. In some example embodiments, after the formation of the second interlayer insulating layer 120, a planarization process (e.g., a CMP process) may be performed to planarize the top surface of the second interlayer insulating layer 120. The planarization process may be performed to reduce a difference in height of the second interlayer insulating layer 120 between the first and second regions R1 and R2, which is caused by the presence of the resistor structure RS. In some example embodiments, the planarization process may be omitted. For example, in the case where the resistor pattern RP is formed of a low-resistance material (e.g., titanium nitride), the resistor pattern RP may be formed to have a small thickness, which allows the difference in height of the second interlayer insulating layer 120 between the first and second regions R1 and R2 to be controlled within an allowable range. In this case, it may be possible to omit the planarization process.

Thereafter, on the first region R1, a source/drain contact hole 125a may be formed to sequentially penetrate the second and first interlayer insulating layers 120 and 110 and to expose the source/drain regions SD, and a gate contact hole 125b may be formed to sequentially penetrate the second interlayer insulating layer 120, the first interlayer insulating layer 110, and the gate capping pattern GC and to expose the gate electrode GE. The source/drain contact hole 125a and the gate contact hole 125b may be respectively formed by different patterning processes. For example, a first patterning process may be performed to form the source/drain contact hole 125a, and then, a second patterning process may be performed to form the gate contact hole 125b, or vice versa. The source/drain contact hole 125a may be formed to be deeper than the gate contact hole 125b. Each of the first and second patterning processes may include forming a mask pattern on the second interlayer insulating layer 120 and performing an anisotropic etching process, in which the mask pattern is used as an etch mask.

During the first or second patterning process, a lower contact hole 125c may be formed to penetrate the second interlayer insulating layer 120, the resistor structure RS, and the first interlayer insulating layer 110 on the second region R2. In the case where the lower contact hole 125c is formed during the second patterning process (e.g., the lower contact hole 125c and the gate contact hole 125b are formed at the same time), a bottom surface of the lower contact hole 125c may be formed at a level corresponding to that of the gate contact hole 125b. By contrast, in the case where the lower contact hole 125c is formed during the first patterning process (e.g., the lower contact hole 125c and the source/drain contact hole 125a are formed at the same time), the bottom surface of the lower contact hole 125c may be formed at a level corresponding to that of the source/drain contact hole 125a. In some example embodiments, the lower contact hole 125c may be formed by a third patterning process, which is different from the first and second patterning processes. According to some example embodiments of inventive concepts, the dummy gate patterns DGP may not be formed below the connection region RP_C of the resistor pattern RP, and thus, even if the lower contact hole 125c is formed to penetrate the connection region RP_C, it is possible to limit and/or prevent the dummy gate patterns DGP from being exposed by the lower contact hole 125c. Accordingly, it may be possible to increase the process margin in the process of forming the lower contact hole 125c.

Referring back to FIGS. 2 to 4, the source/drain contact CA, the gate contact CB, and the lower contact CC may be formed in the source/drain contact hole 125a, the gate contact hole 125b, and the lower contact hole 125c, respectively. For example, the formation of the source/drain contact CA, the gate contact CB, and the lower contact CC may include filling the source/drain contact hole 125a, the gate contact hole 125b, and the lower contact hole 125c with a conductive material, and then, planarizing the conductive material to expose the top surface of the second interlayer insulating layer 120. Accordingly, each of the source/drain contact CA and the gate contact CB may be formed to have a top surface that is coplanar with the top surface of the second interlayer insulating layer 120 of the first region R1, and the lower contact CC may be formed to have a top surface that is coplanar with the top surface of the second interlayer insulating layer 120 of the second region R2. The conductive material may be formed of or include at least one of doped semiconductor materials (e.g., doped poly-silicon), metal nitrides (e.g., titanium nitride, tungsten nitride, or tantalum nitride), or metals (e.g., tungsten, titanium, or tantalum).

The etch stop layer ESL and the third interlayer insulating layer 130 may be sequentially formed on the second interlayer insulating layer 120. The etch stop layer ESL may be formed of or include a silicon nitride layer, a silicon carbo-nitride layer, or an aluminum nitride layer and may be formed by a CVD or PVD process. The third interlayer insulating layer 130 may be formed of or include at least one of a silicon oxide layer, a silicon oxynitride layer, a silicon nitride layer, or low-k dielectric materials whose dielectric constants are lower than that of the silicon oxide layer.

Next, the first via Va, the second via Vb, and the connection via Vc may be formed to be coupled to the source/drain contact CA, the gate contact CB, and the lower contact CC, respectively. Each of the first and second vias Va and Vb may be formed to penetrate the third interlayer insulating layer 130 and the etch stop layer ESL on the first region R1. The connection via Vc may be formed to penetrate the third interlayer insulating layer 130 and the etch stop layer ESL on the second region R2. The vias Va, Vb, and Vc may be formed of or include a metallic material (e.g., copper). The first to third interconnection lines Ma, Mb, and Mc may be formed on the third interlayer insulating layer 130 and may be coupled to the first via Va, the second via Vb, and the connection via Vc, respectively. The first to third interconnection lines Ma, Mb, and Mc may be formed of or include a metallic material (e.g., copper) and may be formed by, for example, a damascene process.

In the above embodiments, the resistor pattern RP may be formed before the contacts (e.g., the source/drain contact CA, the gate contact CB, and/or the lower contact CC) and thus, the resistor pattern RP may be formed at a level lower than top surfaces of the contacts CA, CB, and CC. For convenience, such a structure is referred to as a resistor-first structure. By contrast, in the case where the resistor pattern RP is formed after the contacts CA, CB, and CC, it is called a resistor-last structure. Hereinafter, some example embodiments for the resistor-last structure will be described.

Figure 14:
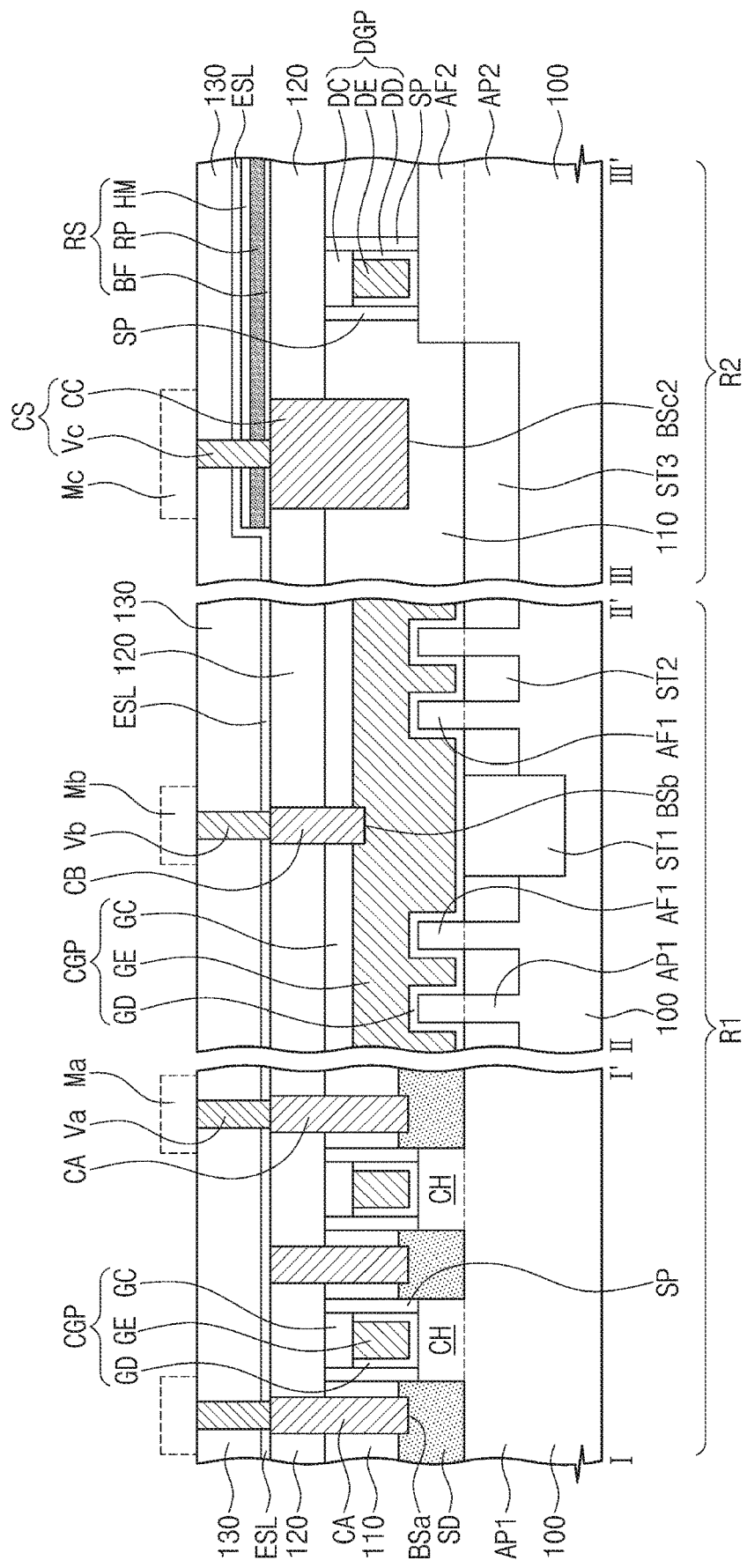
FIG. 14 is a sectional view, which is taken along lines I-I', II-II', and III-III' of FIG. 2 and is provided to illustrate a semiconductor device according to some example embodiments of inventive concepts.
Figure 15:
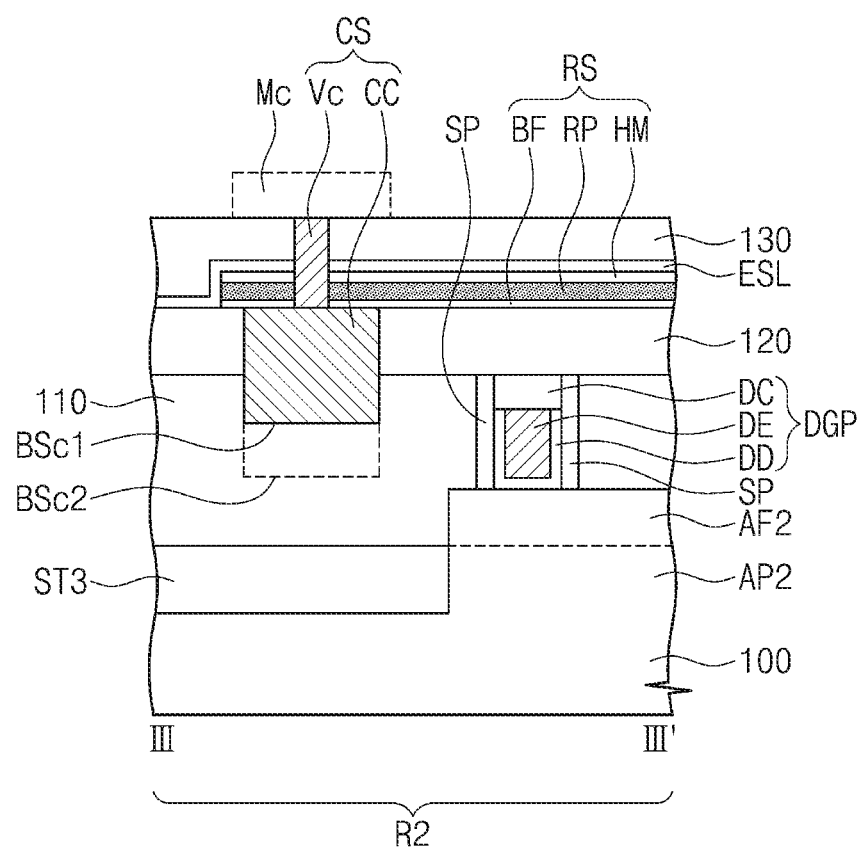
FIGS. 15 and 16 are sectional views taken along line III-III' of FIG. 2.
Figure 16:
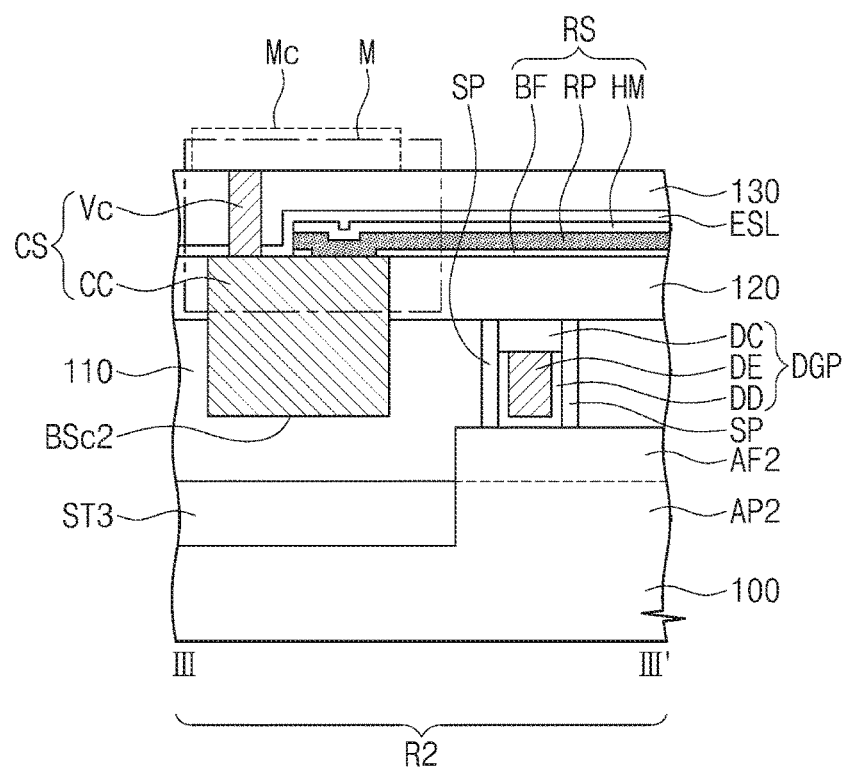
Figure 17:
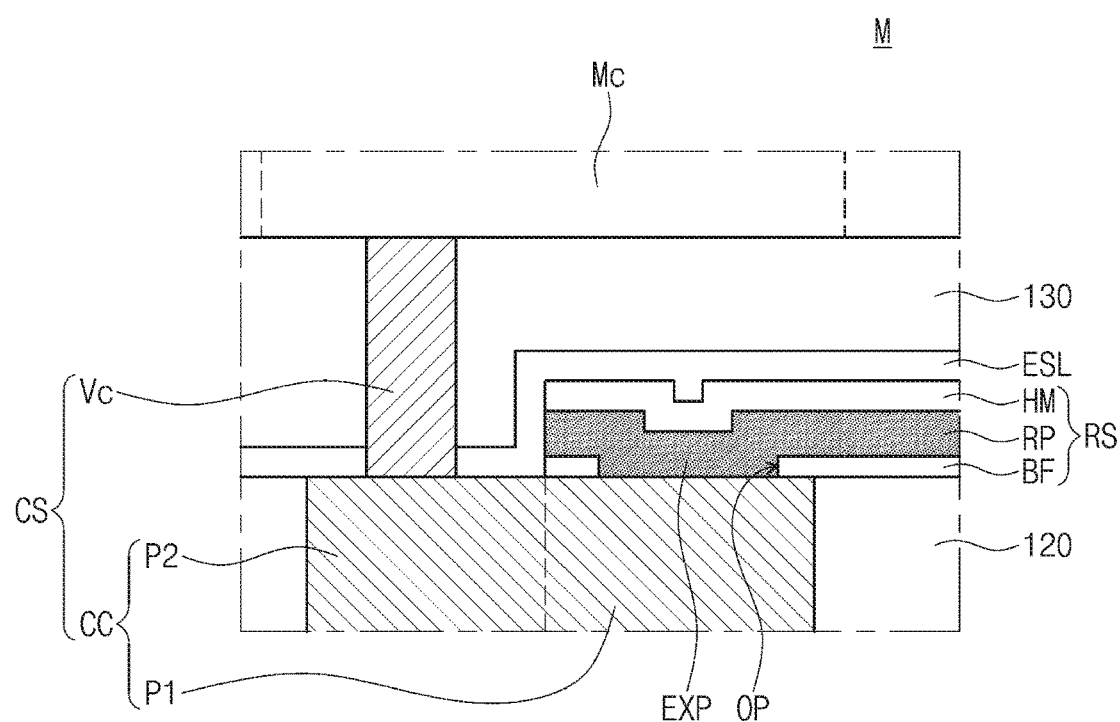
FIG. 17 is an enlarged view of a portion M of FIG. 16.
Figure 18:
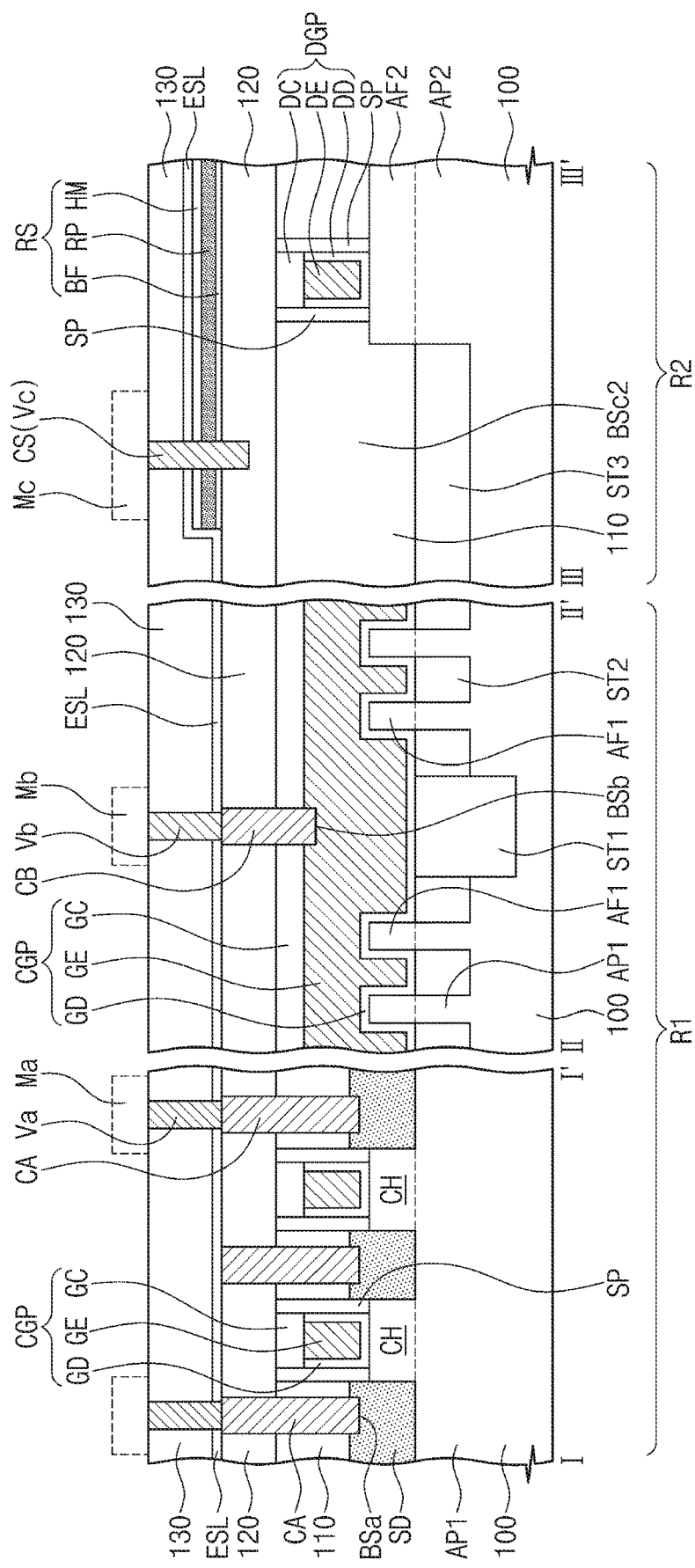
FIG. 18 is a sectional view, which corresponds to lines I-I', II-II' and III-III' of FIG. 2 and is provided to illustrate a modification of a connection structure of FIG. 14.

FIG. 14 is a sectional view, which is taken along lines I-I', II-II', and III-III' of FIG. 2 and is provided to illustrate a semiconductor device according to some example embodiments of inventive concepts. FIGS. 15 and 16 are sectional views taken along line III-III' of FIG. 2. FIG. 17 is an enlarged view of a portion M of FIG. 16. FIG. 18 is a sectional view, which corresponds to lines I-I', II-II' and III-III' of FIG. 2 and is provided to illustrate a modification of a connection structure of FIG. 14. The first region R1 may be configured to have substantially the same features as those described with reference to FIGS. 2 to 4. Here, the resistor pattern RP may be provided to have the resistor-last structure. In other words, the resistor pattern RP may be provided at a level higher than the top surfaces of contacts CA, CB, and CC. For concise description, a previously described element may be identified by a similar or identical reference number without repeating an overlapping description thereof.

Referring to FIGS. 2 and 14, the resistor structure RS may be provided on the second interlayer insulating layer 120 of the second region R2. For example, the resistor pattern RP may be provided in the third interlayer insulating layer 130 of the second region R2. On the second region R2, the etch stop layer ESL may be provided between the second and third interlayer insulating layers 120 and 130 to cover the resistor pattern RP. The buffer insulating pattern BF may be interposed between the resistor pattern RP and the second interlayer insulating layer 120, and the hard mask pattern HM may be interposed between the top surface of the resistor pattern RP and the etch stop layer ESL. In some example embodiments, the buffer insulating pattern BF and/or the hard mask pattern HM may be omitted.

Similar to that described with reference to FIGS. 2 to 4, the resistor pattern RP may have a plate shape and may include the body region RP_B and the connection regions RP_C extending from both end portions of the body region RP_B. The dummy gate patterns DGP may be provided below the body region RP_B, and the connection structure CS may be provided on each of the connection regions RP_C. In some example embodiments, the lower contact CC of the connection structure CS may be provided below the resistor pattern RP and may be spaced apart from the resistor pattern RP. For example, the lower contact CC may be provided in the second interlayer insulating layer 120, and the buffer insulating pattern BF may be interposed between the resistor pattern RP and the lower contact CC. Accordingly, the lower contact CC may not be in direct contact with the resistor pattern RP. The lower contact CC may be extended into the first interlayer insulating layer 110. In some example embodiments, as shown in FIG. 14, the bottom surface BSc2 of the lower contact CC may be formed at a level corresponding to the bottom surface BSa of the source/drain contact CA. In this case, the bottom surface BSc2 of the lower contact CC may be positioned at a level that is substantially equal to or lower than the bottom surface BSa of the source/drain contact CA. In some example embodiments, as shown in FIG. 15, the bottom surface BSc1 of the lower contact CC may be formed at a level corresponding to the bottom surface BSb of the gate contact CB. In this case, the bottom surface BSc1 of the lower contact CC may be positioned at a level that is higher than the bottom surface BSa of the source/drain contact CA and is lower than the bottom surface BSb of the gate contact CB.

The connection via Vc may be provided in the third interlayer insulating layer 130 of the second region R2 and may be coupled to the connection region RP_C of the resistor pattern RP. In some example embodiments, the connection via Vc may have a structure completely penetrating the resistor structure RS. For example, the connection via Vc may be provided to penetrate all of the third interlayer insulating layer 130, the etch stop layer ESL, and the resistor structure RS and to be in contact with the lower contact CC. In general, a lower or bottom portion of the connection via Vc may be formed to have a width smaller than that of an upper or top portion thereof. Thus, in the case where the connection via Vc is formed to be coupled to the upper portion of the resistor pattern RP, a void may be formed in the lower portion of the connection via Vc, and this may lead to an electro migration (EM) failure in an operation of a semiconductor device. In some example embodiments, to limit and/or prevent such a failure, the connection via Vc may be formed to completely penetrate the resistor pattern RP. Accordingly, the side surface of the connection via Vc may be in direct contact with the resistor pattern RP. In some example embodiments, the lower contact CC may be used as a dummy contact, on which the lower portion of the connection via Vc is formed or landed. In this case, the lower contact CC and the dummy gate patterns DGP may be referred to as a dummy structure.

In some example embodiments, the lower contact CC may be used as a connector of electrically connecting the connection via Vc to the resistor pattern RP. For example, as shown in FIGS. 16 and 17, the lower contact CC may include a first portion P1, which is overlapped with or positioned below the resistor pattern RP, and a second portion P2, which is not overlapped with or not positioned below the resistor pattern RP. The resistor pattern RP may be coupled to the first portion P1 of the lower contact CC. For example, the resistor pattern RP may include an extended portion EXP, which is extended into the buffer insulating pattern BF and is coupled to the first portion P1 of the lower contact CC. The buffer insulating pattern BF may be formed to have an opening OP exposing the first portion P1 of the lower contact CC, and the extended portion EXP of the resistor pattern RP may be provided in the opening OP of the buffer insulating pattern BF. The connection via Vc may be spaced apart from the resistor pattern RP and may be coupled to the second portion P2 of the lower contact CC. That is, the connection via Vc may be provided on the second region R2 to sequentially penetrate the third interlayer insulating layer 130 and the etch stop layer ESL and thus may be coupled to the second portion P2 of the lower contact CC. Accordingly, the connection via Vc may be electrically connected to the resistor pattern RP through the lower contact CC.

In some example embodiments, as shown in FIG. 18, the lower contact CC may be omitted. For example, the connection structure CS may be configured to have only the connection via Vc. Here, the connection via Vc may be provided to completely penetrate the resistor pattern RP in the vertical direction, thereby extending beyond the bottom surface of the resistor pattern RP.

Although not shown, the resistor-last structure may be applied to the embodiments of FIGS. 8A and 8B in a similar manner. For example, in the embodiments for the resistor-last structure, the second active patterns AP2 may be omitted, and thus, the dummy gate patterns DGP may be provided on a field isolation region (e.g., the third device isolation patterns ST3). In this case, the third device isolation patterns ST3 may have a thickness that is substantially equal to that of the first device isolation pattern ST1 and is greater than that of the second device isolation patterns ST2. In addition, although not shown, the resistor-last structure may be applied to the embodiments of FIGS. 7A and 7B or the embodiments of FIG. 9 in a similar manner.

Other features may be substantially the same as those described with reference to FIGS. 2 to 4, and thus, detailed description thereof will be omitted. A fabrication method, in some example embodiments associated with a resistor-last structure, will be described below.

Figure 19:
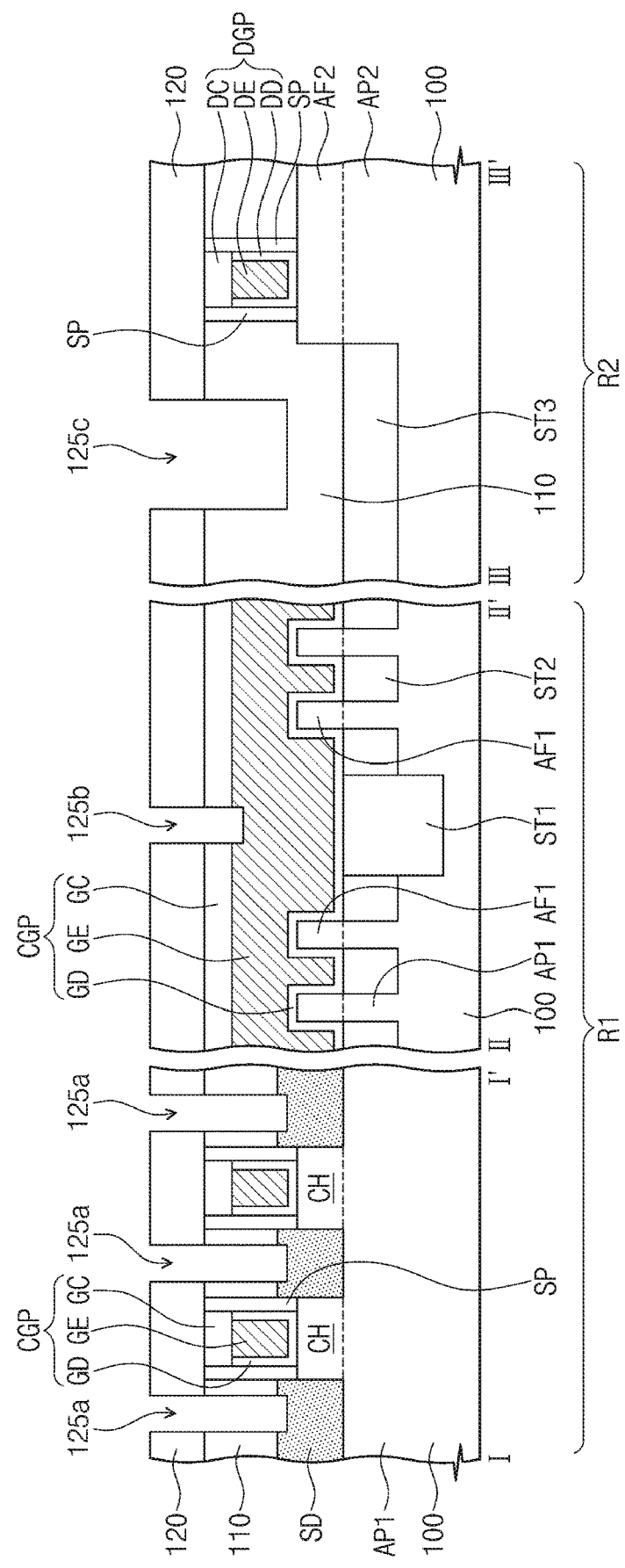
FIGS. 19 to 21 are sectional views, which include vertical sections corresponding to lines I-I', II-II', and III-III' of FIG. 2 and are provided to illustrate a method of fabricating a semiconductor device according to some example embodiments of inventive concepts.
Figure 20:
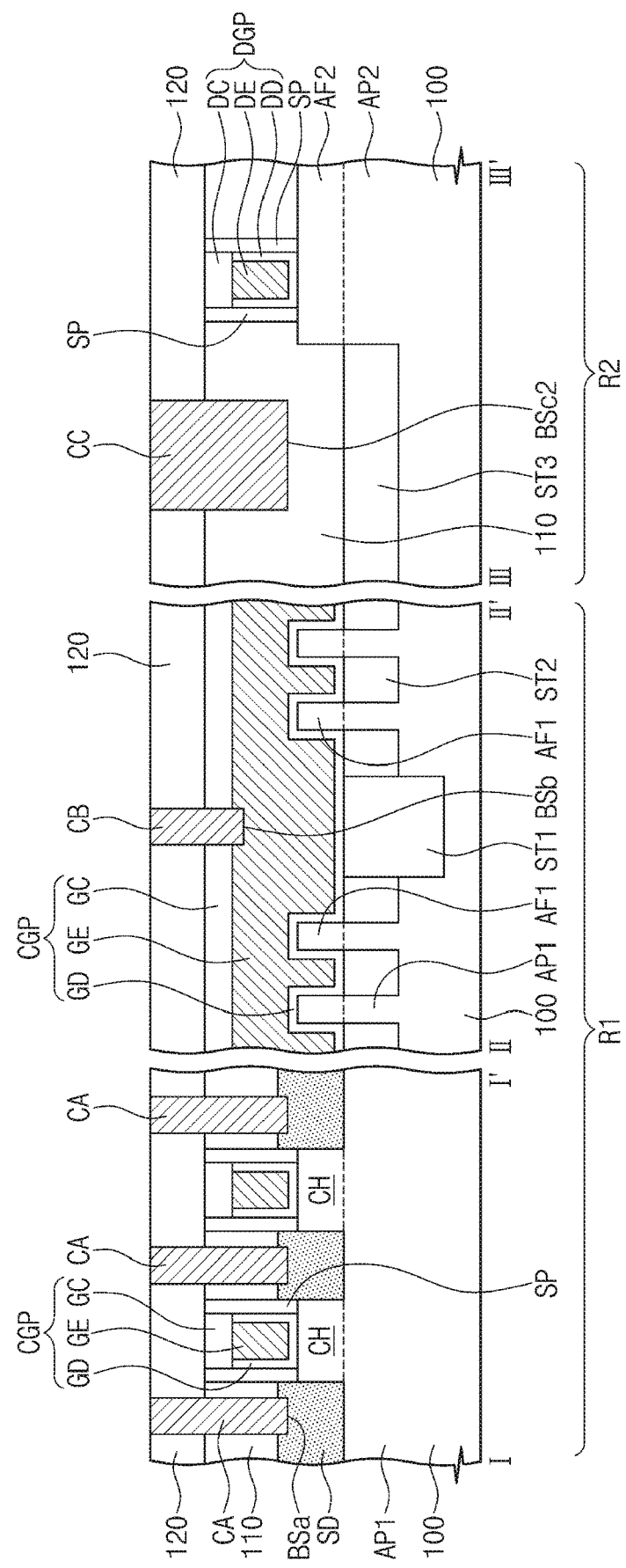
Figure 21:
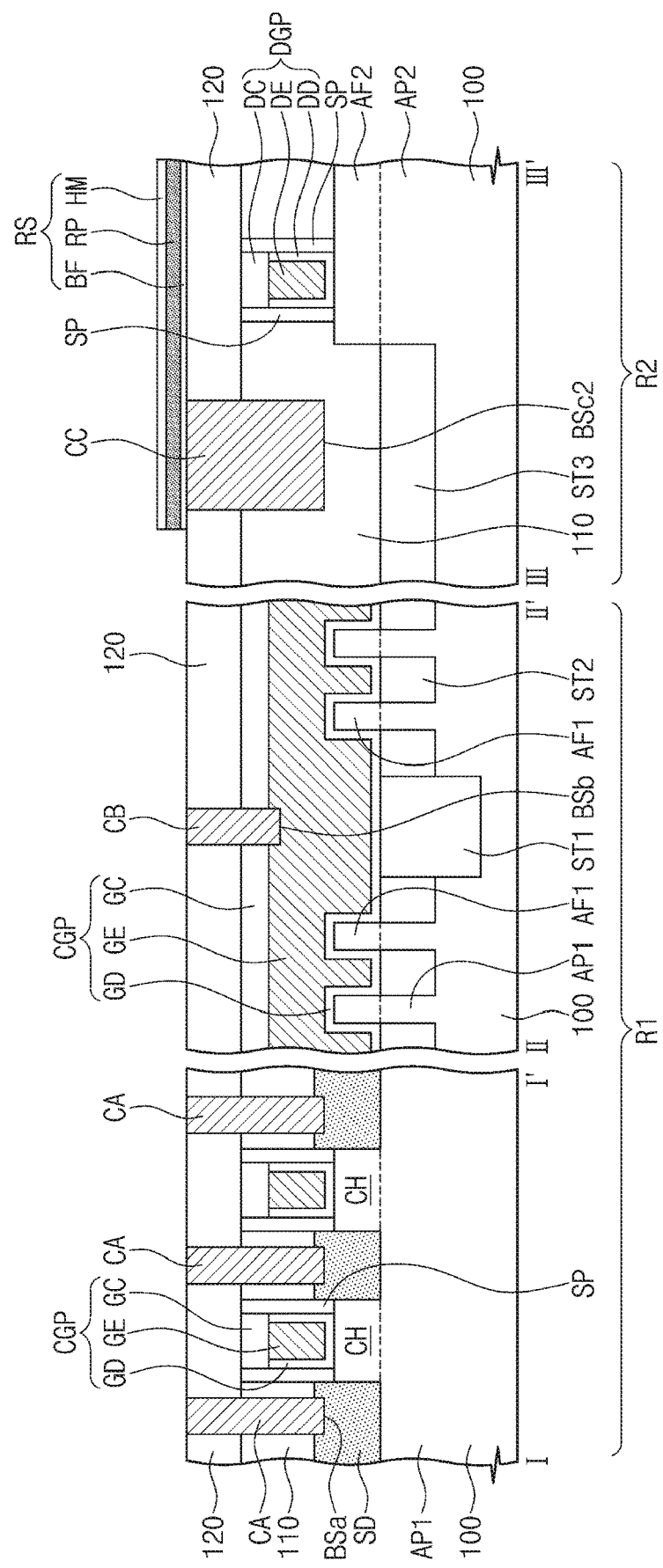

FIGS. 19 to 21 are sectional views, which include vertical sections corresponding to lines I-I', II-II', and III-III' of FIG. 2 and are provided to illustrate a method of fabricating a semiconductor device according to some example embodiments of inventive concepts. For concise description, a previously described element may be identified by a similar or identical reference number without repeating an overlapping description thereof.

Referring to FIGS. 2 and 19, after the step described with reference to FIG. 11, the second interlayer insulating layer 120 may be formed on the first interlayer insulating layer 110. The second interlayer insulating layer 120 may be formed to cover the top surfaces of the cell and dummy gate patterns CGP and DGP.

On the first region R1, the source/drain contact hole 125a may be formed to sequentially penetrate the second and first interlayer insulating layers 120 and 110 and to expose the source/drain regions SD, and the gate contact hole 125b may be formed to sequentially penetrate the second interlayer insulating layer 120, the first interlayer insulating layer 110, and the gate capping pattern GC and to expose the gate electrode GE. The source/drain contact hole 125a and the gate contact hole 125b may be respectively formed by different patterning processes. During forming the source/drain contact hole 125a or the gate contact hole 125b, the lower contact hole 125c may be formed on the second region R2 to sequentially penetrate the second and first interlayer insulating layers 120 and 110. The source/drain contact hole 125a, the gate contact hole 125b, and the lower contact hole 125c may be formed by a method, which is the same as or similar to that described with reference to FIGS. 1 and 10.

Referring to FIGS. 2 and 20, the source/drain contact CA, the gate contact CB, and the lower contact CC may be formed in the source/drain contact hole 125a, the gate contact hole 125b, and the lower contact hole 125c, respectively. The source/drain contact CA, the gate contact CB, and the lower contact CC may be formed using the method and materials that are the same as or similar to those of the previous embodiments described with reference to FIGS. 2 to 4. For example, the formation of the source/drain contact CA, the gate contact CB, and the lower contact CC may include filling the source/drain contact hole 125a, the gate contact hole 125b, and the lower contact hole 125c with a conductive material, and then, planarizing the conductive material to expose the top surface of the second interlayer insulating layer 120.

Referring to FIGS. 2 and 21, the resistor structure RS may be formed on the second interlayer insulating layer 120 of the second region R2. The resistor structure RS may include the buffer insulating pattern BF, the resistor pattern RP, and the hard mask pattern HM, which are sequentially stacked on the second interlayer insulating layer 120. The buffer insulating pattern BF, the resistor pattern RP, and the hard mask pattern HM may be formed using the method and materials that are the same as or similar to those of the previous embodiments described with reference to FIGS. 2 and 12. In some example embodiments, the resistor pattern RP may be formed to be overlapped with the entire top surface of the lower contact CC below the resistor pattern RP. In some example embodiments, the resistor pattern RP may be formed to be overlapped with a portion of the lower contact CC below the resistor pattern RP. In this case, as shown in FIGS. 16 and 17, the resistor pattern RP may be formed to have the extended portion EXP, which penetrates the buffer insulating pattern BF and is coupled to the first portion P1 of the lower contact CC.

Referring back to FIGS. 2 and 14, the etch stop layer ESL and the third interlayer insulating layer 130 may be sequentially formed on the second interlayer insulating layer 120. The etch stop layer ESL may be formed to directly cover the resistor structure RS and the top surfaces of the source/drain and gate contacts CA and CB. Thereafter, the first via Va, the second via Vb, and the connection via Vc may be formed to be coupled to the source/drain contact CA, the gate contact CB, and the lower contact CC, respectively. For example, the first and second vias Va and Vb may be formed by forming first and second via holes on the first region R1 and filling the first and second via holes with a metallic material (e.g., copper). Here, the first and second via holes may be formed to penetrate the third interlayer insulating layer 130 and the etch stop layer ESL and to expose the source/drain and gate contacts CA and CB, respectively.

In the case where the resistor pattern RP is formed to be overlapped with the entire top surface of the lower contact CC, the connection via Vc may be formed to completely penetrate the resistor structure RS, as shown in FIG. 14. For example, the formation of the connection via Vc may include forming a connection via hole to penetrate the third interlayer insulating layer 130, the etch stop layer ESL, and the resistor structure RS on the second region R2 and to expose the lower contact CC and then filling the connection via hole with a metallic material (e.g., copper).

In the case where the resistor pattern RP is formed to be overlapped with a portion of the lower contact CC, the connection via Vc may be formed to penetrate the third interlayer insulating layer 130 and the etch stop layer ESL on the second region R2 and to be in direct contact with the second portion P2 of the lower contact CC, as shown in FIGS. 16 and 17. For example, the formation of the connection via Vc may include forming a connection via hole to penetrate the third interlayer insulating layer 130 and the etch stop layer ESL and to expose the lower contact CC and then filling the connection via hole with a metallic material (e.g., copper). In some example embodiments, the process of forming the connection via hole may be performed to etch only insulating materials, and thus, the process may be easily performed, compared to the case that the process is performed to penetrate the resistor pattern RP or to etch not only insulating materials but also metallic materials.

The first to third interconnection lines Ma, Mb, and Mc may be formed on the third interlayer insulating layer 130 and may be coupled to the first via Va, the second via Vb, and the connection via Vc, respectively. The first to third interconnection lines Ma, Mb, and Mc may be formed of or include a metallic material (e.g., copper) and may be formed by, for example, a damascene process.

Figure 22:
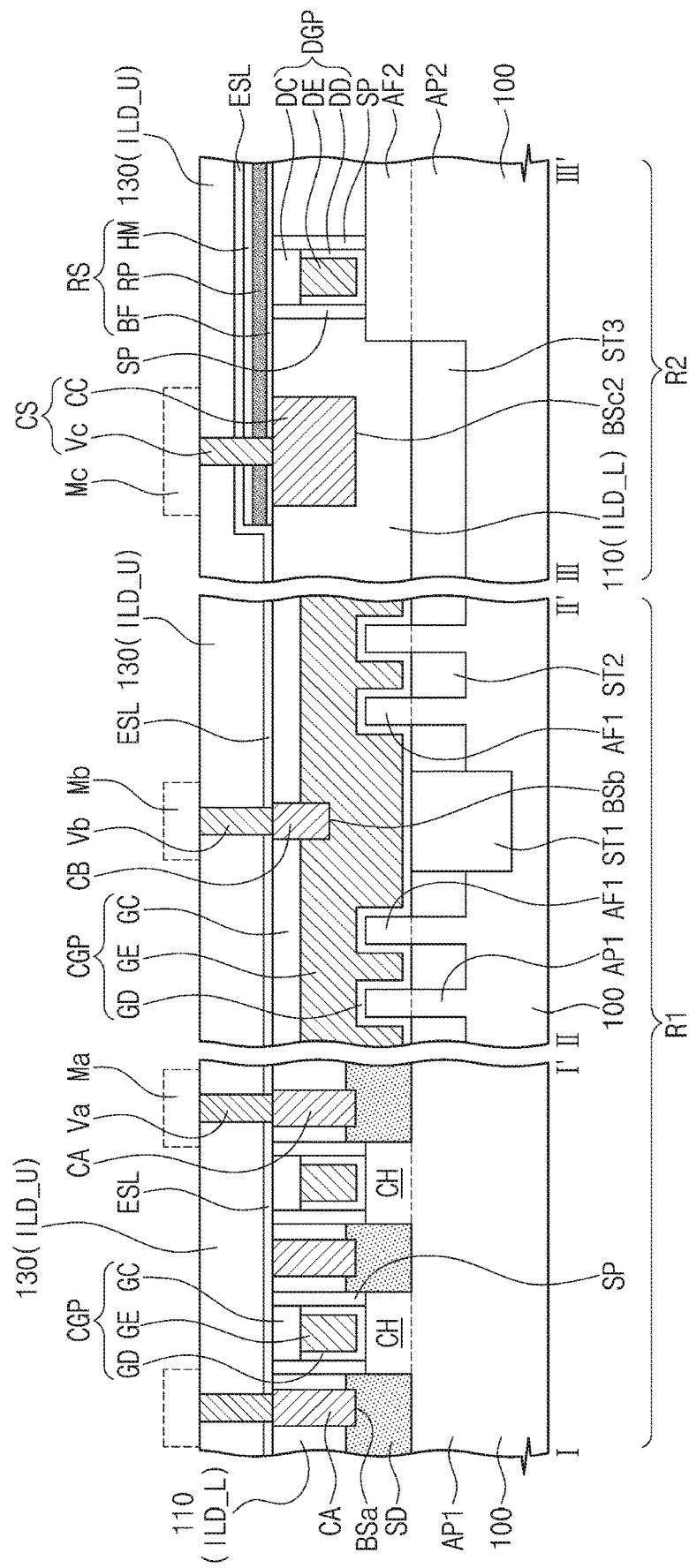
FIG. 22 is a sectional view, which is taken along lines I-I', II-II', and III-III' of FIG. 2 and is provided to illustrate a semiconductor device according to some example embodiments of inventive concepts.
Figure 23:
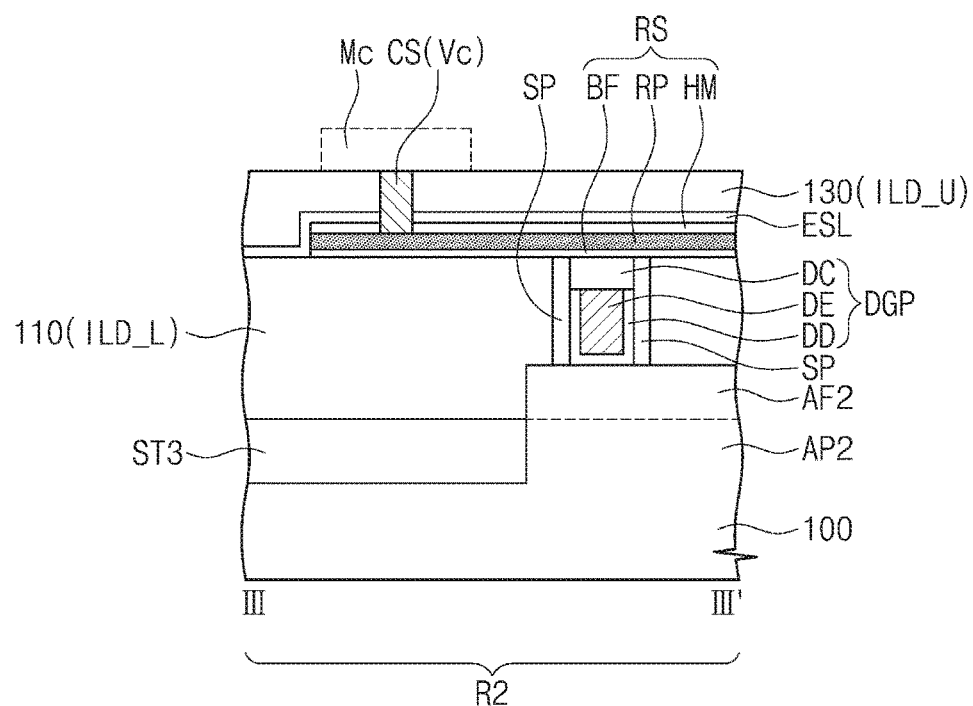
FIGS. 23 and 24 are sectional views taken along line III-III' of FIG. 2.
Figure 24:
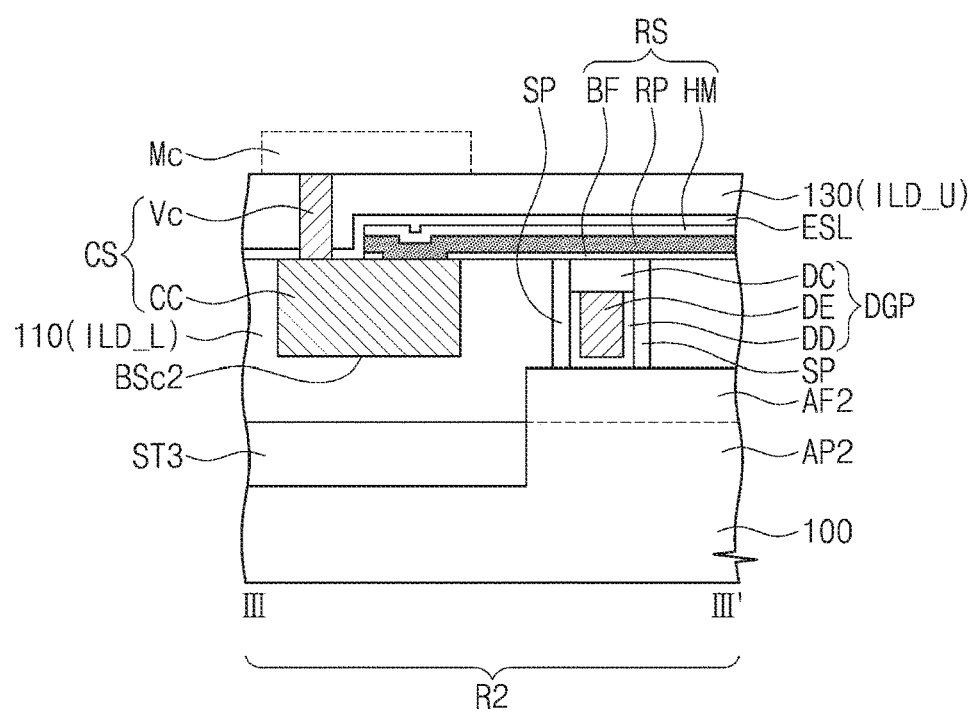

FIG. 22 is a sectional view, which is taken along lines I-I', II-II', and III-III' of FIG. 2 and is provided to illustrate a semiconductor device according to some example embodiments of inventive concepts. FIGS. 23 and 24 are sectional views taken along line III-III' of FIG. 2. In some example embodiments, the second interlayer insulating layer 120 may be omitted. Except for this difference, the semiconductor device in FIGS. 23 and 24 may have substantially the same features as those described in FIG. 14. Thus, a previously described element may be identified by a similar or identical reference number without repeating an overlapping description thereof, for concise description.

Referring to FIGS. 2 and 22, the lower interlayer insulating layer ILD_L may be configured to have only the first interlayer insulating layer 110, without the second interlayer insulating layer 120. Furthermore, the source/drain contact CA, the gate contact CB, and the lower contact CC may be provided in the first interlayer insulating layer 110. For example, the top surface of the first interlayer insulating layer 110 of the first region R1 may be positioned at the same level as the top surfaces of the source/drain contact CA, the gate contact CB, and the gate capping pattern GC. That is, the top surface of the first interlayer insulating layer 110 of the first region R1 may be substantially coplanar with the top surfaces of the source/drain contact CA, the gate contact CB, and the gate capping pattern GC. In addition, the top surface of the first interlayer insulating layer 110 of the second region R2 may be positioned at the same level as the top surfaces of the lower contact CC and the dummy capping pattern DC. That is, the top surface of the first interlayer insulating layer 110 of the second region R2 may be substantially coplanar with the top surfaces of the lower contact CC and the dummy capping pattern DC.

The resistor pattern RP may be provided on the lower interlayer insulating layer ILD_L of the second region R2. For example, the resistor pattern RP may be provided in the third interlayer insulating layer 130 of the second region R2 (e.g., the upper interlayer insulating layer ILD_U).

In the case where the lower interlayer insulating layer ILD_L is configured to have only the first interlayer insulating layer 110, it is possible to reduce the thickness of the lower interlayer insulating layer ILD_L and to decrease vertical lengths of the source/drain contact CA, the gate contact CB, and the lower contact CC, compared with the embodiments of FIG. 14. Accordingly, it is possible to realize a semiconductor device with improved electric characteristics (e.g., low parasitic capacitance and low RC delay property).

In some example embodiments, as shown in FIG. 23, the lower contact CC may be omitted. For example, the connection structure CS may be configured to have only the connection via Vc. In this case, the lower portion of the connection via Vc may be coupled to the upper portion of the resistor pattern RP. Alternatively, the connection via Vc may be provided to completely penetrate the resistor structure RS and extend into the lower interlayer insulating layer ILD_L. In this case, the side surface of the connection via Vc may be directly connected to the resistor pattern RP.

In some example embodiments, as shown in FIG. 24, the connection structure CS may be configured in such a way that the connection via Vc is electrically connected to the resistor pattern RP through the lower contact CC. In other words, the lower contact CC may be used as a connector electrically connecting the connection via Vc to the resistor pattern RP. The connection structure CS may be configured to have substantially the same structural features as those of the previous embodiments described with reference to FIGS. 16 and 17, and thus, a detailed description thereof will be omitted.

Figure 25:
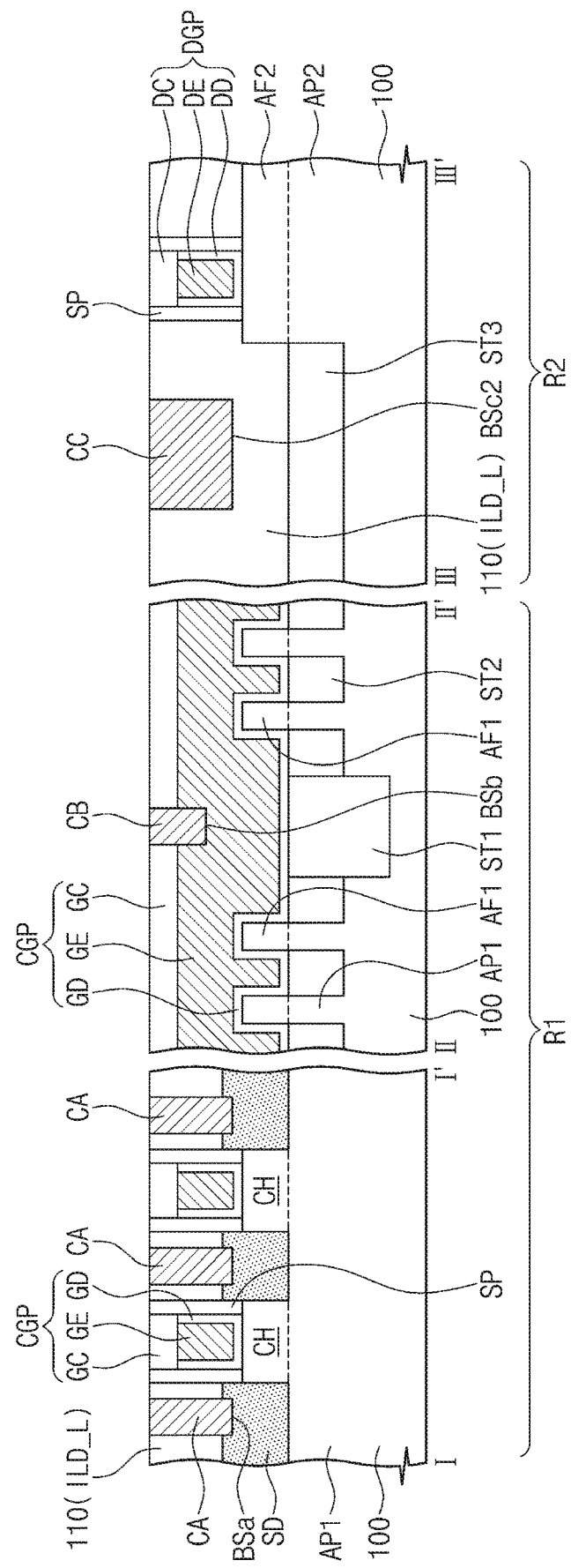
FIG. 25 is a sectional view, which includes vertical sections corresponding to lines I-I', II-II', and III-III' of FIG. 2 and is provided to illustrate a method of fabricating a semiconductor device according to some example embodiments of inventive concepts.

FIG. 25 is a sectional view, which includes vertical sections corresponding to lines I-I', II-II', and III-III' of FIG. 2 and is provided to illustrate a method of fabricating a semiconductor device according to some example embodiments of inventive concepts. For concise description, a previously described element may be identified by a similar or identical reference number without repeating an overlapping description thereof.

Referring to FIGS. 2 and 25, the second interlayer insulating layer 120 and the contacts CA, CB, and CC in the second interlayer insulating layer 120 may be removed in the step described with reference to FIG. 20. This removal process may be performed through a planarization process (e.g., a CMP process and/or an etch-back process). The planarization process may be performed until the top surfaces of the first interlayer insulating layer 110, the gate capping pattern GC, and the dummy capping pattern DC are exposed. In some example embodiments for the resistor-last structure, since the resistor pattern RP is formed after the contacts CA, CB, and CC, the removal process may be possible without damage of the resistor pattern RP.

Next, the process described with reference to FIG. 12 and FIG. 21 may be performed to form the semiconductor device of FIG. 25.

According to some example embodiments of inventive concepts, dummy gate patterns may not be provided below connection regions of a resistor pattern, and thus, even if a lower contact is formed to penetrate the resistor pattern, the lower contact may not be connected to the dummy gate electrode. Accordingly, it is possible to reduce a variation in resistance of the resistor pattern and thereby to increase reliability of a semiconductor device.

According to some example embodiments of inventive concepts, a resistor pattern may be formed at a level higher than those of a source/drain pattern and a gate contact, and thus, it is possible to reduce a thickness of a lower interlayer insulating layer and vertical lengths of the source/drain patterns and the gate contacts. Accordingly, it is possible to realize a semiconductor device with improved electric characteristics (e.g., low parasitic capacitance and low RC delay property).

While some example embodiments of inventive concepts have been particularly shown and described, it will be understood by one of ordinary skill in the art that variations in form and detail may be made therein without departing from the spirit and scope of the attached claims. For example, structures and arrangements of several patterns (e.g., source/drain contacts, lower contacts, vias, connection vias, a resistor pattern, and dummy gate patterns) provided on first and second regions are not limited to the examples illustrated in the accompanying drawings, but may be applied to semiconductor devices according to various embodiments of inventive concepts. It is to be understood, therefore, that example embodiments described above are to be considered illustrative and not restrictive in any manner.

What is claimed is:

1. A semiconductor device, comprising:
a substrate including a first region and a second region, the first region includes a first MOSFET region and a second MOSFET region;
a resistor pattern on the second region;
a first device isolation pattern between the first MOSFET region and the second MOSFET region;
a second device isolation pattern on the first MOSFET region and the second MOSFET region; and
a third device isolation pattern on the second region,
a bottom surface of the second device isolation pattern is positioned at a different level than that of a bottom surfaces of the first and third device isolation patterns.

2. The device of claim 1, further comprising:
a cell gate pattern on the first region; and
a dummy gate pattern on the second region.

3. The device of claim 2, wherein
the resistor pattern over the dummy gate pattern,
the resistor pattern includes a body region and connection regions at both sides of the body region,
the dummy gate pattern overlapping the body region in a plan view.

4. The device of claim 3, further comprising:
a connection structure coupled to each of the connection regions,
the dummy gate pattern not overlapping with the connection regions in a plan view.

5. The device of claim 1, further comprising:
a lower interlayer insulating layer covering the first and second regions.

6. The device of claim 5, wherein
the lower interlayer insulating layer of the second region is provided below the resistor pattern.

7. The device of claim 5, further comprising:
a buffer insulating pattern between the resistor pattern and the lower interlayer insulating layer of the second region.

8. A semiconductor device, comprising:
a substrate including a first region and a second region, the first region includes a first MOSFET region and a second MOSFET region;
a resistor pattern on the second region;
a first device isolation pattern between the first MOSFET region and the second MOSFET region;
a second device isolation pattern on the first MOSFET region and the second MOSFET region; and
a third device isolation pattern on the second region,
a bottom surface of the second device isolation pattern is positioned at a higher level than that of a bottom surfaces of the first and third device isolation patterns.

9. The device of claim 8, further comprising:
a cell transistor on the first region;
a dummy structure on the second region, the dummy structure including a dummy contact; and
a lower interlayer insulating layer covering the cell transistor and the dummy structure.

10. The device of claim 9, further comprising:
a contacts in the lower interlayer insulating layer of the first region; and
a connection via connected to the resistor pattern and the dummy contact,
the contacts coupled to the cell transistor.

11. The device of claim 9, wherein
the resistor pattern being arranged so the dummy contact is below the resistor pattern.

12. The device of claim 10, further comprising:
the connection via penetrates the resistor pattern in a vertical direction.

13. The device of claim 10, wherein
the dummy contact comprises a first portion and a second portion,
the first portion is provided below the resistor pattern and overlaps the resistor pattern,
the second portion extends from the first portion,
the second portion does not overlap the resistor pattern,
the first portion contacts the resistor pattern,
the connection via is spaced apart from the resistor pattern,
the connection via contacts the second portion,
the connection via is spaced apart from the resistor pattern,
the connection via contacts the second portion.

14. The device of claim 13, further comprising:
a buffer insulating pattern between the resistor pattern and the lower interlayer insulating layer of the second region, wherein
the buffer insulating pattern defines an opening exposing the first portion of the dummy contact,
the resistor pattern includes an extended portion,
the extended portion extends into the opening and contacts the first portion.

15. A semiconductor device, comprising:
a substrate including a first region and a second region, the first region includes a first MOSFET region and a second MOSFET region;
a resistor pattern on the second region;

a first device isolation pattern between the first MOSFET region and the second MOSFET region;
a second device isolation pattern on the first MOSFET region and the second MOSFET region; and
a third device isolation pattern on the second region,
a bottom surface of the third device isolation pattern is positioned at a higher level than that of a bottom surface of the first device isolation pattern,
a bottom surface of the second device isolation pattern is positioned at a higher level than that of the bottom surface of the third device isolation pattern.

16. The device of claim 15, further comprising:
a cell transistor on the first region;
a dummy structure on the second region, the dummy structure including a dummy contact;
a lower interlayer insulating layer covering the cell transistor and the dummy structure; and
contacts in the lower interlayer insulating layer of the first region.

17. The device of claim 16, wherein
the cell transistor includes a cell gate pattern and a source/drain region at a side of the cell gate pattern,
the contacts includes a gate contact in contact with the cell gate pattern and a source/drain contact in contact with the source/drain region.

18. The device of claim 17, wherein
a top surface of the source/drain contact and a top surface of the gate contact are coplanar with a top surface of the lower interlayer insulating layer of the first region.

19. The device of claim 16, wherein
the resistor pattern includes a body region and connection regions at both sides of the body region,
the dummy structure further includes a dummy gate pattern below the body region.

20. The device of claim 19, wherein
the dummy gate pattern overlaps the body region and does not overlap the connection regions, when viewed in a plan view.

* * * * *